(12) United States Patent
Itoh

(10) Patent No.: US 11,373,868 B2
(45) Date of Patent: Jun. 28, 2022

(54) METHOD FOR MANUFACTURING SILICON CARBIDE EPITAXIAL SUBSTRATE

(71) Applicant: SUMITOMO ELECTRIC INDUSTRIES, LTD., Osaka (JP)

(72) Inventor: Hironori Itoh, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/276,338

(22) PCT Filed: Aug. 8, 2019

(86) PCT No.: PCT/JP2019/031349
§ 371 (c)(1),
(2) Date: Mar. 15, 2021

(87) PCT Pub. No.: WO2020/115950
PCT Pub. Date: Jun. 11, 2020

(65) Prior Publication Data
US 2022/0044934 A1    Feb. 10, 2022

(30) Foreign Application Priority Data

Dec. 5, 2018 (JP) .............................. JP2018-227913

(51) Int. Cl.
*C30B 25/14* (2006.01)
*C30B 29/36* (2006.01)
(Continued)

(52) U.S. Cl.
CPC .... *H01L 21/2053* (2013.01); *H01L 21/02378* (2013.01); *H01L 29/1608* (2013.01); *H01L 29/66053* (2013.01)

(58) Field of Classification Search
CPC ......... H01L 21/02378; H01L 21/02529; H01L 29/1608; C30B 29/36; C30B 25/14; C30B 25/16; C30B 25/165; C23C 16/325
See application file for complete search history.

(56) References Cited

U.S. PATENT DOCUMENTS

2007/0010033 A1* 1/2007 Aderhold ................ C30B 23/02
257/E21.09
2015/0221498 A1* 8/2015 Genba ................. H01L 21/0257
438/478
(Continued)

FOREIGN PATENT DOCUMENTS

JP    2010-037643 A    2/2010
JP    2014-154666 A    8/2014
(Continued)

*Primary Examiner* — Eric A. Ward
(74) *Attorney, Agent, or Firm* — Renner, Otto, Boisselle & Sklar, LLP

(57) ABSTRACT

In a step of calculating formation conditions for the second silicon carbide layer, a formation time of the second silicon carbide layer is calculated as a value obtained by multiplying a value obtained by dividing the second thickness by the first thickness, by the first formation time, and a flow rate of a second ammonia gas in a step of forming the second silicon carbide layer by epitaxial growth is calculated as a value obtained by multiplying a value obtained by dividing the second concentration by the first concentration, by the first flow rate.

8 Claims, 18 Drawing Sheets

(51) Int. Cl.
*H01L 21/02* (2006.01)
*H01L 21/205* (2006.01)
*H01L 29/16* (2006.01)
*H01L 29/66* (2006.01)

(56) References Cited

U.S. PATENT DOCUMENTS

| | | | |
|---|---|---|---|
| 2018/0040480 A1 | 2/2018 | Imai | |
| 2018/0237942 A1 | 8/2018 | Wada | |
| 2019/0013392 A1 | 1/2019 | Takeuchi | |
| 2020/0043725 A1 | 2/2020 | Wada | |
| 2020/0144053 A1* | 5/2020 | Hamano | H01L 29/1608 |

FOREIGN PATENT DOCUMENTS

| | | |
|---|---|---|
| JP | 2015-042602 A | 3/2015 |
| JP | 2017-152487 A | 8/2017 |
| JP | 2018-022853 A | 2/2018 |
| WO | 2017/056691 A1 | 4/2017 |
| WO | 2018/078944 A1 | 5/2018 |

* cited by examiner

METHOD FOR MANUFACTURING SILICON CARBIDE EPITAXIAL SUBSTRATE

TECHNICAL FIELD

The present disclosure relates to a method for manufacturing a silicon carbide epitaxial substrate. The present application claims priority to Japanese Patent Application No. 2018-227913 filed on Dec. 5, 2018, the entire contents of which are incorporated herein by reference.

BACKGROUND ART

WO2017/056691 (PTL 1) discloses a method for epitaxially growing a silicon carbide layer on a silicon carbide single crystal substrate.

CITATION LIST

Patent Literature

PTL 1: WO2017/056691

SUMMARY OF INVENTION

A method for manufacturing a silicon carbide epitaxial substrate in accordance with the present disclosure includes the following steps. A first silicon carbide layer is formed on a first silicon carbide substrate, using a first ammonia gas as a dopant gas. A thickness of the first silicon carbide layer and a carrier concentration of the first silicon carbide layer are measured. Formation conditions for a second silicon carbide layer are calculated. The second silicon carbide layer is formed on a second silicon carbide substrate, using a second ammonia gas as a dopant gas. When a flow rate of the first ammonia gas in the step of forming the first silicon carbide layer by epitaxial growth is defined as a first flow rate, a formation time of the first silicon carbide layer in the step of forming the first silicon carbide layer by epitaxial growth is defined as a first formation time, the thickness of the first silicon carbide layer is defined as a first thickness, the carrier concentration of the first silicon carbide layer is defined as a first concentration, a target thickness of the second silicon carbide layer is defined as a second thickness, and a target carrier concentration of the second silicon carbide layer is defined as a second concentration, in the step of calculating the formation conditions for the second silicon carbide layer, a second formation time of the second silicon carbide layer is calculated as a value obtained by multiplying a value obtained by dividing the second thickness by the first thickness, by the first formation time, and a second flow rate of the second ammonia gas in the step of forming the second silicon carbide layer by epitaxial growth is calculated as a value obtained by multiplying a value obtained by dividing the second concentration by the first concentration, by the first flow rate. In the step of forming the second silicon carbide layer by epitaxial growth, the second silicon carbide layer is formed using the second formation time and the second flow rate. The step of forming the first silicon carbide layer by epitaxial growth and the step of forming the second silicon carbide layer by epitaxial growth are performed using an identical apparatus.

DETAILED DESCRIPTION

Figure 1:
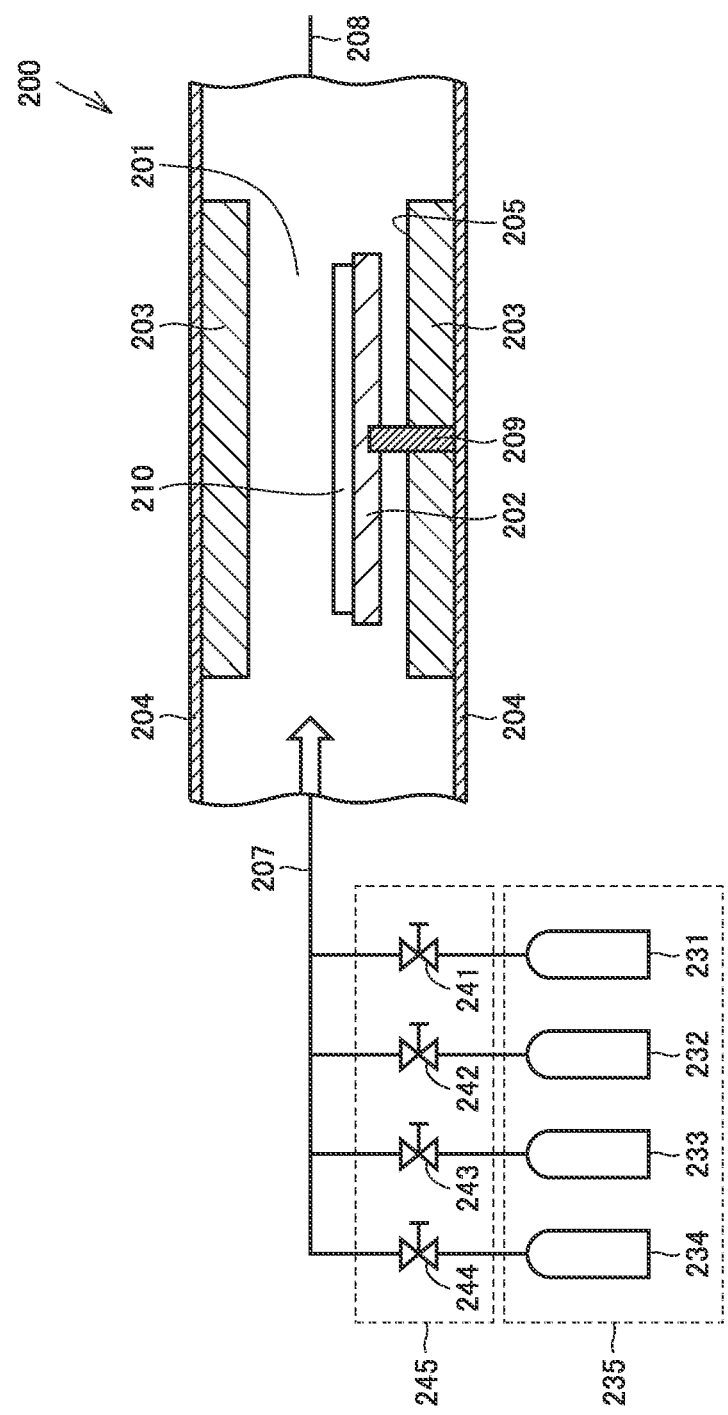
FIG. 1 is a schematic partial cross sectional view showing a configuration of a manufacturing apparatus for a silicon carbide epitaxial substrate.

Problem to be Solved by the Present Disclosure

An object of the present disclosure is to improve the accuracy of the carrier concentration of a silicon carbide layer, while simplifying a condition adjustment step.

Advantageous Effect of the Present Disclosure

According to the present disclosure, it is possible to improve the accuracy of the carrier concentration of a silicon carbide layer, while simplifying a condition adjustment step.

Summary of Embodiments of the Present Disclosure

First, a summary of embodiments of the present disclosure will be described.

Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral, but is indicated by putting the negative sign before the numeral in the present specification.

(1) A method for manufacturing a silicon carbide epitaxial substrate 100 in accordance with the present disclosure includes the following steps. A first silicon carbide layer 10 is formed on a first silicon carbide substrate 110, using a first ammonia gas as a dopant gas. A thickness of first silicon carbide layer 10 and a carrier concentration of first silicon carbide layer 10 are measured. Formation conditions for a second silicon carbide layer 20 are calculated. Second silicon carbide layer 20 is formed on a second silicon carbide substrate 120, using a second ammonia gas as a dopant gas. When a flow rate of the first ammonia gas in the step of forming first silicon carbide layer 10 is defined as a first flow rate, a formation time of first silicon carbide layer 10 in the step of forming first silicon carbide layer 10 is defined as a first formation time, the thickness of first silicon carbide layer 10 is defined as a first thickness, the carrier concentration of first silicon carbide layer 10 is defined as a first concentration, a target thickness of second silicon carbide layer 20 is defined as a second thickness, and a target carrier concentration of second silicon carbide layer 20 is defined as a second concentration, in the step of calculating the formation conditions for second silicon carbide layer 20, a second formation time of second silicon carbide layer 20 is calculated as a value obtained by multiplying a value obtained by dividing the second thickness by the first thickness, by the first formation time, and a second flow rate of the second ammonia gas in the step of forming second silicon carbide layer 20 is calculated as a value obtained by multiplying a value obtained by dividing the second concentration by the first concentration, by the first flow rate. In the step of forming second silicon carbide layer 20, second silicon carbide layer 20 is formed using the second formation time and the second flow rate. The step of forming first silicon carbide layer 10 by epitaxial growth and the step of forming second silicon carbide layer 20 by epitaxial growth are performed using an identical apparatus.

(2) In the method for manufacturing silicon carbide epitaxial substrate 100 in accordance with (1) described above, the value obtained by dividing the second concentration by the first concentration may be more than or equal to 0.1 and less than or equal to 5.

(3) In the method for manufacturing silicon carbide epitaxial substrate 100 in accordance with (1) or (2) described above, a value obtained by dividing the first thickness by the first formation time may be more than or equal to 5 μm/hour and less than or equal to 30 μm/hour.

(4) In the method for manufacturing silicon carbide epitaxial substrate 100 in accordance with any of (1) to (3) described above, when a carrier concentration of first silicon carbide substrate 110 is defined as a first substrate concentration, the first concentration may be lower than half of the first substrate concentration.

(5) The method for manufacturing silicon carbide epitaxial substrate 100 in accordance with any of (1) to (4) described above may further include steps of: forming a third silicon carbide layer 30 on a third silicon carbide substrate 130, using a third ammonia gas as a dopant gas; measuring a thickness of third silicon carbide layer 30 and a carrier concentration of third silicon carbide layer 30; calculating formation conditions for a fourth silicon carbide layer 40; and forming fourth silicon carbide layer 40 on second silicon carbide substrate 120, using a fourth ammonia gas as a dopant gas, before the step of forming second silicon carbide layer 20. Second silicon carbide layer 20 may be formed on fourth silicon carbide layer 40. When a flow rate of the third ammonia gas in the step of forming third silicon carbide layer 30 is defined as a third flow rate, a formation time of third silicon carbide layer 30 in the step of forming third silicon carbide layer 30 is defined as a third formation time, the thickness of third silicon carbide layer 30 is defined as a third thickness, the carrier concentration of third silicon carbide layer 30 is defined as a third concentration, a target thickness of fourth silicon carbide layer 40 is defined as a fourth thickness, and a target carrier concentration of fourth silicon carbide layer 40 is defined as a fourth concentration, in the step of calculating the formation conditions for fourth silicon carbide layer 40, a fourth formation time of fourth silicon carbide layer 40 may be calculated as a value obtained by multiplying a value obtained by dividing the fourth thickness by the third thickness, by the third formation time, and a fourth flow rate of the fourth ammonia gas in the step of forming fourth silicon carbide layer 40 may be calculated as a value obtained by multiplying a value obtained by dividing the fourth concentration by the third concentration, by the third flow rate. In the step of forming fourth silicon carbide layer 40, fourth silicon carbide layer 40 may be formed using the fourth formation time and the fourth flow rate. The step of forming third silicon carbide layer 30 by epitaxial growth and the step of forming fourth silicon carbide layer 40 by epitaxial growth are performed using an identical apparatus.

(6) In the method for manufacturing silicon carbide epitaxial substrate 100 in accordance with (5) described above, the value obtained by dividing the fourth concentration by the third concentration may be more than or equal to 0.1 and less than or equal to 5.

(7) In the method for manufacturing silicon carbide epitaxial substrate 100 in accordance with (5) or (6) described above, a value obtained by dividing the third thickness by the third formation time may be more than or equal to 5 μm/hour and less than or equal to 30 μm/hour.

(8) In the method for manufacturing silicon carbide epitaxial substrate 100 in accordance with any of (5) to (7) described above, when a carrier concentration of third silicon carbide substrate 130 is defined as a third substrate concentration, the third concentration may be lower than half of the third substrate concentration.

Details of Embodiments of the Present Disclosure

An embodiment of the present disclosure (hereinafter also referred to as "the present embodiment") will be described below. However, the present embodiment is not limited thereto. In the description below, identical or corresponding elements will be designated by identical reference numerals, and the same description therefor will not be repeated.

(Manufacturing Apparatus for Silicon Carbide Epitaxial Substrate)

First, a configuration of a manufacturing apparatus 200 for silicon carbide epitaxial substrate 100 will be described.

As shown in FIG. 1, manufacturing apparatus 200 for silicon carbide epitaxial substrate 100 is a hot wall-type lateral chemical vapor deposition (CVD) apparatus, for example. Manufacturing apparatus 200 for silicon carbide epitaxial substrate 100 mainly has a reaction chamber 201, a gas supply unit 235, a control unit 245, a heating element 203, a quartz tube 204, a heat insulating material (not shown), and an induction heating coil (not shown).

Heating element 203 has a cylindrical shape, for example, and forms reaction chamber 201 therein. Heating element 203 is made of graphite, for example. Heating element 203 is provided inside quartz tube 204 to be in contact with an inner circumferential surface of quartz tube 204. The heat insulating material surrounds the outer circumference of heating element 203. The induction heating coil is wound along an outer circumferential surface of quartz tube 204, for example. The induction heating coil is constituted such that an alternating current can be supplied thereto by an external power supply (not shown). Thereby, heating element 203 is induction-heated. As a result, reaction chamber 201 is heated by heating element 203.

Reaction chamber 201 is a space formed by being surrounded by an inner wall surface 205 of heating element 203. A silicon carbide substrate is placed within reaction chamber 201. Reaction chamber 201 is constituted such that it can heat the silicon carbide substrate. Reaction chamber 201 is provided with a susceptor 210 for holding the silicon carbide substrate. The silicon carbide substrate is placed on susceptor 210. Susceptor 210 is placed on a stage 202. Stage 202 is constituted such that it can be rotated by a rotation axis 209. As stage 202 is rotated, susceptor 210 is rotated.

Manufacturing apparatus 200 for silicon carbide epitaxial substrate 100 further has a gas introduction port 207 and a gas exhaust port 208. Gas exhaust port 208 is connected to an exhaust pump not shown. The arrow in FIG. 1 indicates a flow of a gas. The gas is introduced through gas introduction port 207 into reaction chamber 201, and is exhausted through gas exhaust port 208. The pressure within reaction chamber 201 is adjusted by the balance between a gas supply amount and a gas exhaust amount.

Gas supply unit 235 is constituted such that it can supply a mixed gas including a source material gas, a dopant gas, and a carrier gas to reaction chamber 201. Specifically, gas supply unit 235 includes a first gas supply unit 231, a second gas supply unit 232, a third gas supply unit 233, and a fourth gas supply unit 234, for example.

First gas supply unit 231 is constituted such that it can supply a first gas including carbon atoms. First gas supply unit 231 is a gas cylinder filled with the first gas, for example. The first gas is a propane ($C_3H_8$) gas, for example. The first gas may be a methane ($CH_4$) gas, an ethane ($C_2H_6$) gas, an acetylene ($C_2H_2$) gas, or the like, for example.

Second gas supply unit 232 is constituted such that it can supply a second gas including a silane gas. Second gas supply unit 232 is a gas cylinder filled with the second gas, for example. The second gas is a silane ($SiH_4$) gas, for example. The second gas may be a mixed gas of a silane gas and a gas other than the silane gas.

Third gas supply unit 233 is constituted such that it can supply a third gas including an ammonia gas. Third gas supply unit 233 is a gas cylinder filled with the third gas, for example. The third gas is a doping gas including N (nitrogen atoms). The ammonia gas is thermally decomposed more easily than a nitrogen gas having a triple bond.

Fourth gas supply unit 234 is constituted such that it can supply a fourth gas such as hydrogen (a carrier gas), for example. Fourth gas supply unit 234 is a gas cylinder filled with hydrogen, for example.

Control unit 245 is constituted such that it can control the flow rate of the mixed gas to be supplied from gas supply unit 235 to reaction chamber 201. Specifically, control unit 245 may include a first gas flow rate control unit 241, a second gas flow rate control unit 242, a third gas flow rate control unit 243, and a fourth gas flow rate control unit 244. Each control unit may be a mass flow controller (MFC), for example. Control unit 245 is arranged between gas supply unit 235 and gas introduction port 207. In other words, control unit 245 is arranged in a flow channel that connects gas supply unit 235 and gas introduction port 207.

The winding density of the induction heating coil may be changed in an axis direction of reaction chamber 201. The winding density [turns/m] is the number of turns in the coil per unit length in the axis direction of the apparatus. For example, the winding density of the induction heating coil on an upstream side may be higher than the winding density of the induction heating coil on a downstream side, in order to effectively thermally decompose ammonia on the upstream side.

(Method for Calculating Manufacturing Conditions for Silicon Carbide Epitaxial Substrate)

Next, a method for calculating manufacturing conditions for silicon carbide epitaxial substrate 100 in accordance with the present embodiment will be described. First, a silicon carbide single crystal having a polytype of 4H is manufactured by a sublimation method, for example. Then, the silicon carbide single crystal is sliced by a wire saw, for example, to prepare silicon carbide substrate 110 (see FIG. 3). The silicon carbide constituting silicon carbide substrate 110 has a polytype of 4H-SiC, for example. The polytype 4H-SiC is superior to other polytypes in electron mobility, dielectric strength, and the like. Silicon carbide substrate 110 includes nitrogen as an n type impurity. Silicon carbide substrate 110 has an n type conductivity type.

Figure 3:
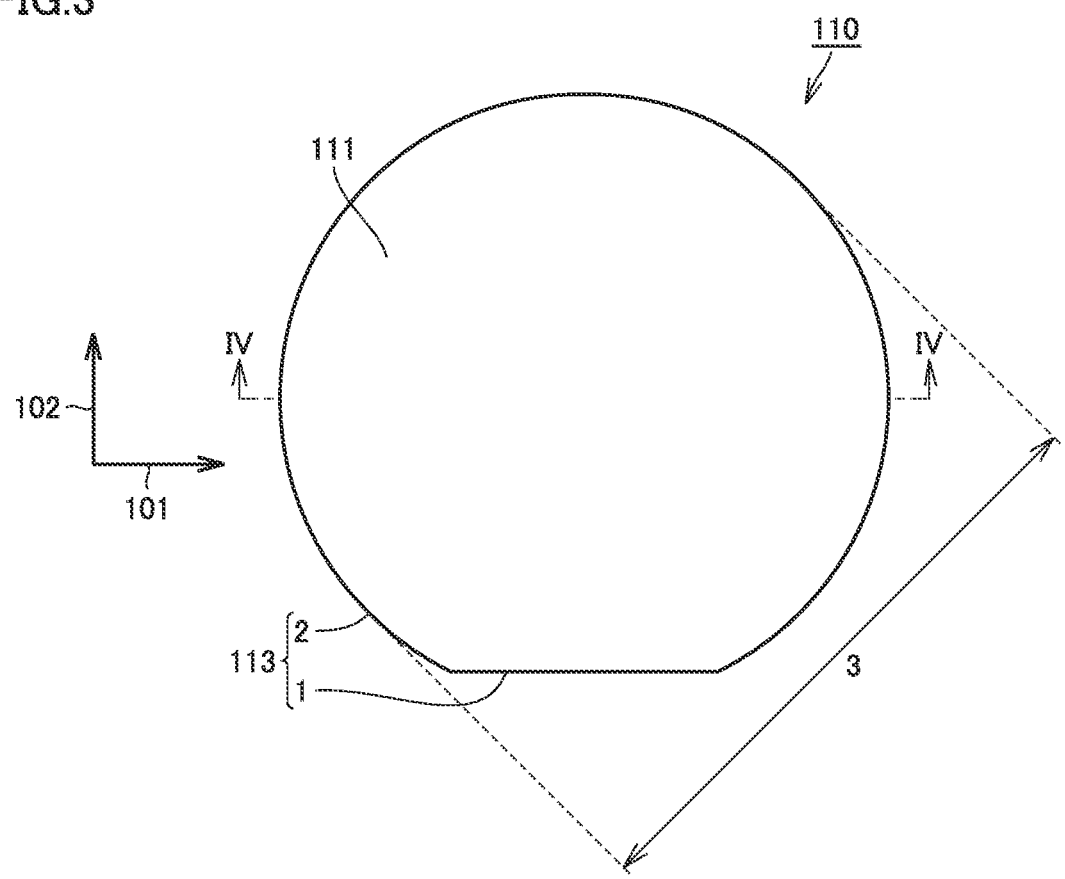
FIG. 3 is a schematic plan view showing a first step of the method for calculating the manufacturing conditions for the silicon carbide epitaxial substrate in accordance with the present embodiment.
Figure 4:
FIG. 4 is a schematic cross sectional view taken along a line IV-IV in FIG. 3.

As shown in FIGS. 3 and 4, silicon carbide substrate 110 has a first main surface 111, a second main surface 112, and an outer edge portion 113. First main surface 111 extends two-dimensionally along each of a first direction 101 and a second direction 102. Second main surface 112 is opposite to first main surface 111. When viewed from a direction perpendicular to first main surface 111, outer edge portion 113 surrounds first main surface 111. Outer edge portion 113 has an orientation flat 1 and an arc-shaped portion 2, for example. Orientation flat 1 extends along first direction 101. Arc-shaped portion 2 is continuous to orientation flat 1.

Second direction 102 is a <1-100> direction, for example. The second direction may be a [1-100] direction, for example. First direction 101 is a direction parallel to first main surface 111 and perpendicular to second direction 102. First direction 101 is a direction including a <11-20> direction component, for example. From another viewpoint, the first direction is a direction in which a <11-20> direction is projected onto a plane parallel to first main surface 111. First direction 101 may be a direction including a [11-20] direction component, for example.

As shown in FIG. 3, a diameter 3 (maximum diameter) of first main surface 111 of silicon carbide substrate 110 is more than or equal to 100 mm. Diameter 3 may be more than or equal to 150 mm, or more than or equal to 200 mm, or more than or equal to 250 mm. The upper limit of diameter 3 is not particularly limited, and the upper limit of diameter 3 may be 300 mm, for example.

First main surface 111 is a {0001} plane or a plane inclined at an angle of less than or equal to 8° relative to the {0001} plane. Specifically, first main surface 111 is a (0001) plane or a plane inclined at an angle of less than or equal to 8° relative to the (0001) plane, for example. When first main surface 111 is inclined relative to the {0001} plane, the direction of inclination (off direction) is the <11-20> direction, for example. The inclined angle (off angle) relative to the {0001} plane may be more than or equal to 1°, or more than or equal to 2°. The off angle may be less than or equal to 7°, or less than or equal to 6°, or less than or equal to 4°. First main surface 111 may be a (000-1) plane or a plane inclined at an angle of less than or equal to 8° relative to the (000-1) plane.

Figure 2:
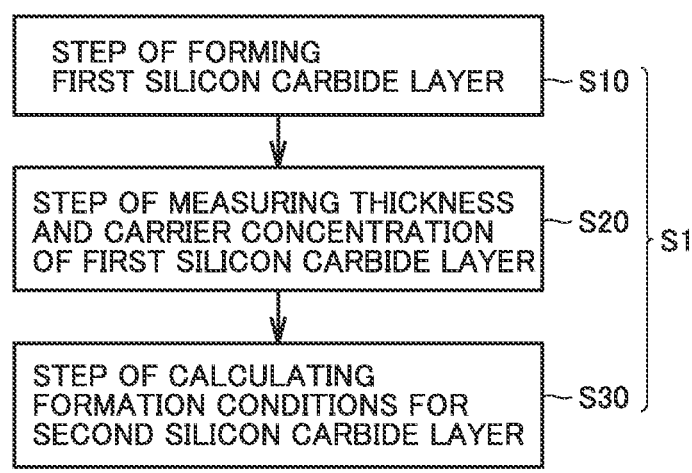
FIG. 2 is a flowchart schematically showing a method for calculating manufacturing conditions for a silicon carbide epitaxial substrate in accordance with the present embodiment.

Subsequently, a step of forming a first silicon carbide layer (S10: FIG. 2) is performed. Specifically, first silicon carbide layer 10 is formed on silicon carbide substrate 110 by epitaxial growth, using manufacturing apparatus 200 described above. First, silicon carbide substrate 110 is placed on susceptor 210. Then, the pressure in reaction chamber 201 is reduced from the atmospheric pressure to about $1\times10^{-6}$ Pa, and thereafter, increasing the temperature of silicon carbide substrate 110 is started. While the temperature is increased, a hydrogen ($H_2$) gas as a carrier gas is introduced from fourth gas supply unit 234 into reaction chamber 201. The flow rate of the hydrogen gas is adjusted by fourth gas flow rate control unit 244.

After the temperature in the reaction chamber reaches about 1600° C., for example, the source material gas, the dopant gas, and the carrier gas are supplied to reaction chamber 201. Specifically, a mixed gas including silane, propane, ammonia (a first ammonia gas), and hydrogen is introduced into reaction chamber 201. In reaction chamber 201, the respective gases are thermally decomposed, and first silicon carbide layer 10 is formed on silicon carbide substrate 110. The flow rates of silane and propane are adjusted such that the mixed gas has a C/Si ratio of about 1.0, for example. The pressure in reaction chamber 201 is 6 kPa, for example.

The flow rate of the second gas (silane gas) to be supplied to reaction chamber 201 is adjusted to 115 sccm, for example, using second gas flow rate control unit 242. The flow rate of the second gas (silane gas) may be more than or equal to 80 sccm and less than or equal to 150 sccm, for example.

Similarly, the flow rate of the first gas (propane gas) to be supplied to reaction chamber 201 is adjusted to 37.5 sccm, for example, using first gas flow rate control unit 241. The flow rate of the first gas (propane gas) may be more than or equal to 25 sccm and less than or equal to 50 sccm, for example.

Similarly, the flow rate of the third gas (ammonia gas) to be supplied to reaction chamber 201 is adjusted to 0.0033 sccm, for example, using third gas flow rate control unit 243. The flow rate of the third gas (ammonia gas) may be more than or equal to 0.001 sccm and less than or equal to 0.1 sccm, for example.

Similarly, the flow rate of the fourth gas (hydrogen gas) to be supplied to reaction chamber 201 is adjusted to 120 slm, for example, using fourth gas flow rate control unit 244. The flow rate of the fourth gas (hydrogen gas) may be more than or equal to 100 slm and less than or equal to 150 slm, for example.

Figure 5:
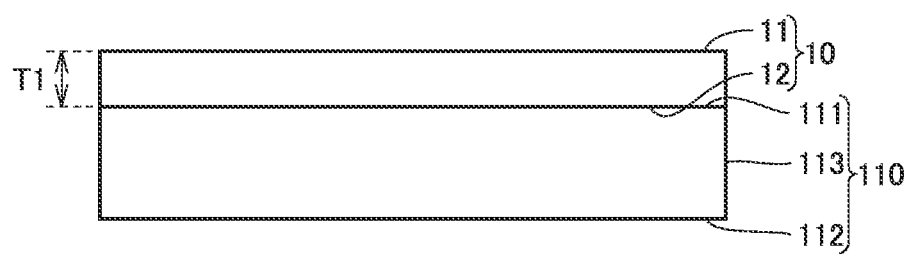
FIG. 5 is a schematic cross sectional view showing a second step of the method for calculating the manufacturing conditions for the silicon carbide epitaxial substrate in accordance with the present embodiment.

As described above, first silicon carbide layer 10 is formed on silicon carbide substrate 110, using the first ammonia gas as a dopant gas (see FIG. 5). First silicon carbide layer 10 has a thickness (a first thickness T1) of more than or equal to 3 μm and less than or equal to 10 μm, for example. First thickness T1 may be more than or equal to 3.5 μm, or more than or equal to 4 μm, for example. First thickness T1 may be less than or equal to 9.5 μm, or less than or equal to 9 μm, for example.

First silicon carbide layer 10 includes nitrogen (N) as an n type impurity. In this case, the carrier is electrons. First silicon carbide layer 10 has a carrier concentration of more than or equal to $1\times10^{14}$ cm$^{-3}$ and less than or equal to $1\times10^{16}$ cm$^{-3}$, for example. As shown in FIG. 5, first silicon carbide layer 10 has a third main surface 11 and a fourth main surface 12. Fourth main surface 12 is opposite to third main surface 11. Fourth main surface 12 is in contact with first main surface 111.

Subsequently, a step of measuring the thickness and the carrier concentration of the first silicon carbide layer (S20: FIG. 2) is performed.

First, a method for measuring the thickness of first silicon carbide layer 10 will be described.

The thickness of first silicon carbide layer 10 can be measured using a Fourier transform infrared spectrometer (FT-IR), for example. The thickness of first silicon carbide layer 10 can be measured by combining a Fourier transform infrared spectrophotometer (IR Prestige-21) manufactured by Shimadzu Corporation and an infrared microscope (AIM-8800) manufactured by Shimadzu Corporation, for example. Measurement of the thickness of first silicon carbide layer 10 with an FT-IR is performed utilizing the difference in optical constant caused by the difference in carrier concentration between first silicon carbide layer 10 and silicon carbide substrate 110. Specifically, the thickness of first silicon carbide layer 10 is measured by emitting infrared light and measuring interference caused by reflection from third main surface 11 of first silicon carbide layer 10 and reflection from an interface between first silicon carbide layer 10 and silicon carbide substrate 110. The measurement wavenumber range is a range from 1500 cm$^{-1}$ to 3500 cm$^{-1}$, for example. The wavenumber interval is about 4 cm$^{-1}$, for example.

The thickness of first silicon carbide layer 10 is measured at a plurality of positions on third main surface 11. The measurement interval in an in-plane direction is 10 mm, for example. Specifically, points that are ±10 mm, ±20 mm, ±30 mm, 40 mm, ±50 mm, and ±60 mm away from the center of third main surface 11 in a direction parallel to first direction 101 are defined as measurement positions for the thickness. Similarly, points that are ±10 mm, ±20 mm, ±30 mm, ±40 mm, ±50 mm, and ±60 mm away from the center of third main surface 11 in a direction parallel to second direction 102 are defined as measurement positions for the thickness. The center of third main surface 11 is also defined as a measurement position for the thickness. An average value of the thicknesses of first silicon carbide layer 10 measured at the plurality of measurement positions is defined as the thickness of first silicon carbide layer 10.

Second, a method for measuring the carrier concentration of first silicon carbide layer 10 will be described.

The carrier concentration of first silicon carbide layer 10 is measured with a mercury probe-type C (capacitance)-V (voltage) measurement apparatus, for example. Specifically, one probe is placed on a third main surface 11 side of first silicon carbide layer 10, and the other probe is placed on a fourth main surface 12 side of first silicon carbide layer 10.

The one probe has an area of 0.01 cm$^2$, for example. A voltage is applied between the one probe and the other probe, and a capacitance between the one probe and the other probe is measured. When the axis of ordinates represents 1/C$^2$ (the reciprocal of the square of the capacitance) and the axis of abscissas represents V (voltage), the carrier concentration is obtained from the inclination of a straight line of measurement data. The measurement voltage range is typically a range of −5 V to 0 V. It should be noted that the carrier concentration may be measured by secondary ion mass spectrometry (SIMS), for example.

The carrier concentration of first silicon carbide layer 10 is measured at a plurality of positions on third main surface 11. The measurement interval in the in-plane direction is 10 mm, for example. Specifically, points that are ±10 mm, ±20 mm, ±30 mm, ±40 mm, ±50 mm, and ±60 mm away from the center of third main surface 11 in the direction parallel to first direction 101 are defined as measurement positions for the carrier concentration. Similarly, points that are ±10 mm, ±20 mm, ±30 mm, ±40 mm, ±50 mm, and ±60 mm away from the center of third main surface 11 in the direction parallel to second direction 102 are defined as measurement positions for the carrier concentration. The center of third main surface 11 is also defined as a measurement position for the carrier concentration. An average value of the carrier concentrations of first silicon carbide layer 10 measured at the plurality of measurement positions is defined as the carrier concentration of first silicon carbide layer 10. As described above, the thickness of first silicon carbide layer 10 and the carrier concentration of first silicon carbide layer 10 are measured.

Subsequently, a step of calculating formation conditions for a second silicon carbide layer (S30: FIG. 2) is performed.

Specifically, a formation time of second silicon carbide layer 20 is calculated. When a formation time of first silicon carbide layer 10 in the step of forming first silicon carbide layer 10 is defined as a first formation time, the thickness of first silicon carbide layer 10 is defined as a first thickness, and a target thickness of second silicon carbide layer 20 is defined as a second thickness, in the step of calculating the formation conditions for second silicon carbide layer 20, the formation time of second silicon carbide layer 20 is calculated as a value obtained by multiplying a value obtained by dividing the second thickness by the first thickness, by the first formation time. As an example, when the first formation time is 6 minutes, the first thickness is 6 μm, and the second thickness is 10 μm, the formation time of second silicon carbide layer 20 is calculated as (10 μm/6 μm)×6 minutes=10 minutes.

A value obtained by dividing the first thickness by the first formation time represents a formation speed of first silicon carbide layer 10. The value obtained by dividing the first thickness by the first formation time is more than or equal to 5 μm/hour and less than or equal to 30 μm/hour, for example. The value obtained by dividing the first thickness by the first formation time may be more than or equal to 7 μm/hour, or more than or equal to 10 μm/hour, for example. The value obtained by dividing the first thickness by the first formation time may be less than or equal to 25 μm/hour, or less than or equal to 20 μm/hour, for example.

Similarly, a flow rate of a second ammonia gas in the step of forming second silicon carbide layer 20 is calculated. When a flow rate of the first ammonia gas in the step of forming first silicon carbide layer 10 is defined as a first flow rate, the carrier concentration of first silicon carbide layer 10 is defined as a first concentration, and a target carrier concentration of second silicon carbide layer 20 is defined as a second concentration, in the step of calculating the formation conditions for second silicon carbide layer 20, the flow rate of the second ammonia gas in the step of forming second silicon carbide layer 20 is calculated as a value obtained by multiplying a value obtained by dividing the second concentration by the first concentration, by the first flow rate. As an example, when the first flow rate is 0.001 sccm, the first concentration is 1×10$^{15}$ cm$^{-3}$, and the second concentration is 2×10$^{15}$ cm$^{-3}$, the flow rate of the second ammonia gas in the step of forming second silicon carbide layer 20 is calculated as (2×10$^{15}$ cm$^{-3}$/1×10$^{15}$ cm$^{-3}$)×0.001 sccm=0.002 sccm.

The value obtained by dividing the second concentration by the first concentration is more than or equal to 0.1 and less than or equal to 5, for example. The value obtained by dividing the second concentration by the first concentration may be more than or equal to 0.2, or more than or equal to 0.3, for example. The value obtained by dividing the second concentration by the first concentration may be less than or equal to 4, or less than or equal to 3, for example. When a carrier concentration of first silicon carbide substrate 110 is defined as a first substrate concentration, the first concentration is lower than half of the first substrate concentration, for example. The first concentration may be lower than one third of the first substrate concentration, or one tenth of the first substrate concentration, for example. As described above, the formation conditions for second silicon carbide layer 20 are calculated.

(Method for Manufacturing Silicon Carbide Epitaxial Substrate)

First Embodiment

Next, a method for manufacturing silicon carbide epitaxial substrate 100 in accordance with a first embodiment will be described.

Figure 6:
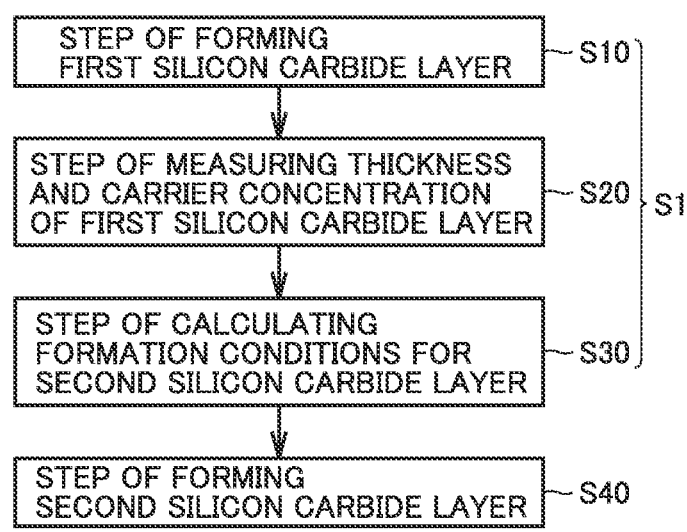
FIG. 6 is a flowchart schematically showing a method for manufacturing a silicon carbide epitaxial substrate in accordance with a first embodiment.

As shown in FIG. 6, the method for manufacturing silicon carbide epitaxial substrate 100 in accordance with the first embodiment mainly has a step of forming the first silicon carbide layer (S10: FIG. 6), a step of measuring the thickness and the carrier concentration of the first silicon carbide layer (S20: FIG. 6), a step of calculating the formation conditions for the second silicon carbide layer (S30: FIG. 6), and a step of forming the second silicon carbide layer (S40: FIG. 6).

First, the step of forming the first silicon carbide layer (S10: FIG. 6) is performed. The step of forming the first silicon carbide layer (S10: FIG. 6) is identical to the step of forming the first silicon carbide layer (S10: FIG. 2) described above. In the step of forming the first silicon carbide layer (S10: FIG. 6), first silicon carbide layer 10 is formed on first silicon carbide substrate 110, using the first ammonia gas as a dopant gas.

Subsequently, the step of measuring the thickness and the carrier concentration of the first silicon carbide layer (S20: FIG. 6) is performed. The step of measuring the thickness and the carrier concentration of the first silicon carbide layer (S20: FIG. 6) is identical to the step of measuring the thickness and the carrier concentration of the first silicon carbide layer (S20: FIG. 2) described above. In the step of measuring the thickness and the carrier concentration of the first silicon carbide layer (S20: FIG. 6), the thickness of first silicon carbide layer 10 and the carrier concentration of first silicon carbide layer 10 are measured.

Subsequently, the step of calculating the formation conditions for the second silicon carbide layer (S30: FIG. 6) is performed. The step of calculating the formation conditions for the second silicon carbide layer (S30: FIG. 6) is identical to the step of calculating the formation conditions for the second silicon carbide layer (S30: FIG. 2) described above. In the step of calculating the formation conditions for the second silicon carbide layer (S30: FIG. 6), the formation conditions for second silicon carbide layer 20 are calculated.

Figure 7:
FIG. 7 is a schematic cross sectional view showing a first step of the method for manufacturing the silicon carbide epitaxial substrate in accordance with the first embodiment.

Subsequently, the step of forming the second silicon carbide layer (S40: FIG. 6) is performed. Specifically, first, second silicon carbide substrate 120 is prepared (see FIG. 7). Second silicon carbide substrate 120 is a substrate different from first silicon carbide substrate 110. Second silicon carbide substrate 120 has physical and chemical properties that are substantially identical to those of first silicon carbide substrate 110. As shown in FIG. 7, second silicon carbide substrate 120 has a fifth main surface 121 and a sixth main surface 122. Sixth main surface 122 is opposite to fifth main surface 121. The silicon carbide constituting second silicon carbide substrate 120 has a polytype of 4H-SiC, for example. Second silicon carbide substrate 120 has a diameter of more than or equal to 150 mm, for example.

Fifth main surface 121 is a {0001} plane or a plane inclined at an angle of less than or equal to 8° relative to the {0001} plane. Specifically, fifth main surface 121 is a (0001) plane or a plane inclined at an angle of less than or equal to 8° relative to the (0001) plane, for example. When fifth main surface 121 is inclined relative to the {0001} plane, the direction of inclination (off direction) is the <11-20> direction, for example. The inclined angle (off angle) relative to the {0001} plane may be more than or equal to 1°, or more than or equal to 2°. The off angle may be less than or equal to 7°, or less than or equal to 6°, or less than or equal to 4°. Fifth main surface 121 may be a (000-1) plane or a plane inclined at an angle of less than or equal to 8° relative to the (000-1) plane.

Subsequently, second silicon carbide layer 20 is formed on second silicon carbide substrate 120 by epitaxial growth, using manufacturing apparatus 200 described above. First, second silicon carbide substrate 120 is placed on susceptor 210. Then, the pressure in reaction chamber 201 is reduced from the atmospheric pressure to about $1 \times 10^{-6}$ Pa, and thereafter, increasing the temperature of second silicon carbide substrate 120 is started. While the temperature is increased, the hydrogen ($H_2$) gas as a carrier gas is introduced from fourth gas supply unit 234 into reaction chamber 201. The flow rate of the hydrogen gas is adjusted by fourth gas flow rate control unit 244.

After the temperature in reaction chamber 201 reaches about 1600° C., for example, the source material gas, the dopant gas, and the carrier gas are supplied to reaction chamber 201. Specifically, a mixed gas including silane, propane, ammonia (the second ammonia gas), and hydrogen is introduced into reaction chamber 201. In reaction chamber 201, the respective gases are thermally decomposed, and second silicon carbide layer 20 is formed on second silicon carbide substrate 120. The flow rates of silane and propane are adjusted such that the mixed gas has a C/Si ratio of about 1.0, for example. The pressure in reaction chamber 201 is 6 kPa, for example.

The temperature in reaction chamber 201 in the step of forming the second silicon carbide layer (S40: FIG. 6) is adjusted to be substantially identical to the temperature in reaction chamber 201 in the step of forming the first silicon carbide layer (S10: FIG. 6). Specifically, the temperature (° C.) in reaction chamber 201 in the step of forming the second silicon carbide layer (S40: FIG. 6) is within a range of ±0.2% of the temperature (° C.) in reaction chamber 201 in the step of forming the first silicon carbide layer (S10: FIG. 6).

The pressure in reaction chamber 201 in the step of forming the second silicon carbide layer (S40: FIG. 6) is adjusted to be substantially identical to the pressure in reaction chamber 201 in the step of forming the first silicon carbide layer (S10: FIG. 6). Specifically, the pressure (kPa) in reaction chamber 201 in the step of forming the second silicon carbide layer (S40: FIG. 6) is within a range of ±2% of the pressure (kPa) in reaction chamber 201 in the step of forming the first silicon carbide layer (S10: FIG. 6).

The flow rate of the second gas (silane gas) in the step of forming the second silicon carbide layer (S40: FIG. 6) is adjusted to be substantially identical to the flow rate of the second gas (silane gas) in the step of forming the first silicon carbide layer (S10: FIG. 6). Specifically, the flow rate (sccm) of the second gas (silane gas) in the step of forming the second silicon carbide layer (S40: FIG. 6) is within a range of ±0.5% of the flow rate (sccm) of the second gas (silane gas) in the step of forming the first silicon carbide layer (S10: FIG. 6).

The flow rate of the first gas (propane gas) in the step of forming the second silicon carbide layer (S40: FIG. 6) is adjusted to be substantially identical to the flow rate of the first gas (propane gas) in the step of forming the first silicon carbide layer (S10: FIG. 6). Specifically, the flow rate (sccm) of the first gas (propane gas) in the step of forming the second silicon carbide layer (S40: FIG. 6) is within a range of ±0.5% of the flow rate (sccm) of the first gas (propane gas) in the step of forming the first silicon carbide layer (S10: FIG. 6).

The flow rate of the fourth gas (hydrogen gas) in the step of forming the second silicon carbide layer (S40: FIG. 6) is adjusted to be substantially identical to the flow rate of the fourth gas (hydrogen gas) in the step of forming the first silicon carbide layer (S10: FIG. 6). Specifically, the flow rate (slm) of the fourth gas (hydrogen gas) in the step of forming the second silicon carbide layer (S40: FIG. 6) is within a range of ±0.5% of the flow rate (slm) of the fourth gas (hydrogen gas) in the step of forming the first silicon carbide layer (S10: FIG. 6).

Figure 8:
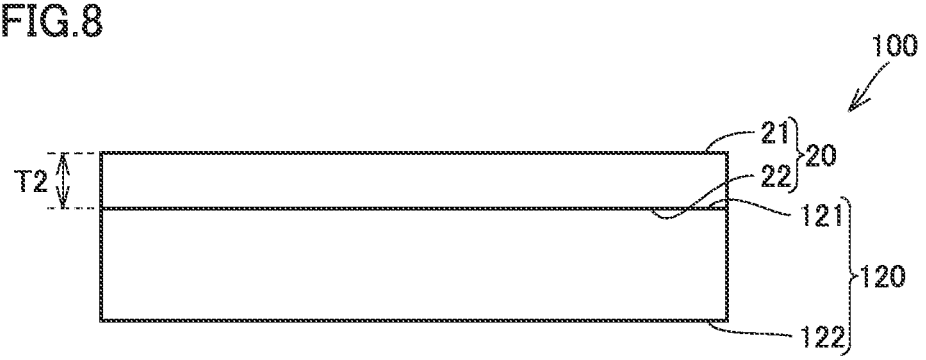
FIG. 8 is a schematic cross sectional view showing a second step of the method for manufacturing the silicon carbide epitaxial substrate in accordance with the first embodiment.

As described above, second silicon carbide layer 20 is formed on second silicon carbide substrate 120, using the second ammonia gas as a dopant gas (see FIG. 8). Second silicon carbide layer 20 has a thickness (a second thickness T2) of more than or equal to 5 μm and less than or equal to 30 μm, for example. Second thickness T2 may be more than or equal to 6 μm, or more than or equal to 7 μm, for example. Second thickness T2 may be less than or equal to 28 μm, or less than or equal to 26 μm, for example. The step of forming the first silicon carbide layer (S10: FIG. 6) and the step of forming the second silicon carbide layer (S40: FIG. 6) are performed using an identical apparatus.

Second silicon carbide layer 20 includes nitrogen (N) as an n type impurity. In this case, the carrier is electrons. Second silicon carbide layer 20 has a carrier concentration of more than or equal to $1 \times 10^{14}$ cm$^{-3}$ and less than or equal to $1 \times 10^{16}$ cm$^{-3}$, for example. As shown in FIG. 8, second silicon carbide layer 20 has a seventh main surface 21 and an eighth main surface 22. Eighth main surface 22 is opposite to seventh main surface 21. Eighth main surface 22 is in contact with fifth main surface 121. As described above, silicon carbide epitaxial substrate 100 having second silicon carbide substrate 120 and second silicon carbide layer 20 is manufactured.

Second Embodiment

Next, a method for manufacturing silicon carbide epitaxial substrate 100 in accordance with a second embodiment will be described.

Figure 9:
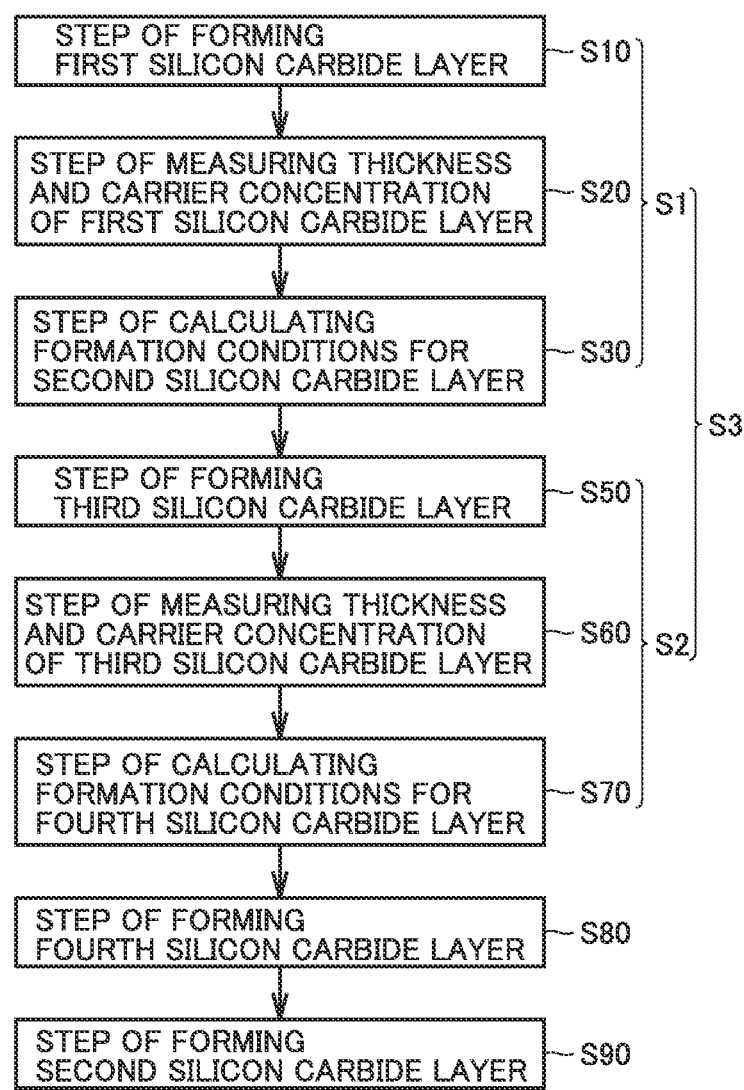
FIG. 9 is a flowchart schematically showing a method for manufacturing a silicon carbide epitaxial substrate in accordance with a second embodiment.

As shown in FIG. 9, the method for manufacturing silicon carbide epitaxial substrate 100 in accordance with the second embodiment mainly has a step of determining formation conditions for silicon carbide layers (S3: FIG. 9), a step of forming a fourth silicon carbide layer (S80: FIG. 9), and a step of forming the second silicon carbide layer (S90: FIG. 9). The step of determining the formation conditions for the silicon carbide layers (S3: FIG. 9) mainly has a step of determining the formation conditions for second silicon carbide layer 20 (S1: FIG. 9), and a step of determining formation conditions for fourth silicon carbide layer 40 (S2: FIG. 9).

The step of determining the formation conditions for second silicon carbide layer 20 (S1: FIG. 9) mainly has a step of forming the first silicon carbide layer (S10: FIG. 9), a step of measuring the thickness and the carrier concentration of the first silicon carbide layer (S20: FIG. 9), and a step of calculating the formation conditions for the second silicon carbide layer (S30: FIG. 9). The step of determining the formation conditions for the fourth silicon carbide layer (S2: FIG. 9) mainly has a step of forming a third silicon carbide layer (S50: FIG. 9), a step of measuring a thickness and a carrier concentration of the third silicon carbide layer (S60: FIG. 9), and a step of calculating the formation conditions for the fourth silicon carbide layer (S70: FIG. 9).

It should be noted that, in the method for manufacturing silicon carbide epitaxial substrate 100 in accordance with the second embodiment, the order of the step of determining the formation conditions for the second silicon carbide layer (S1: FIG. 9) and the step of determining the formation conditions for the fourth silicon carbide layer (S2: FIG. 9) is not particularly limited. The step of determining the formation conditions for the second silicon carbide layer (S1: FIG. 9) may be performed before the step of determining the formation conditions for the fourth silicon carbide layer (S2: FIG. 9), or after the step of determining the formation conditions for the fourth silicon carbide layer (S2: FIG. 9).

First, the step of forming the first silicon carbide layer (S10: FIG. 9) is performed. The step of forming the first silicon carbide layer (S10: FIG. 9) is identical to the step of forming the first silicon carbide layer (S10: FIG. 2) described above. In the step of forming the first silicon carbide layer (S10: FIG. 9), first silicon carbide layer 10 is formed on first silicon carbide substrate 110, using the first ammonia gas as a dopant gas.

Subsequently, the step of measuring the thickness and the carrier concentration of the first silicon carbide layer (S20: FIG. 9) is performed. The step of measuring the thickness and the carrier concentration of the first silicon carbide layer (S20: FIG. 9) is identical to the step of measuring the thickness and the carrier concentration of the first silicon carbide layer (S20: FIG. 2) described above. In the step of measuring the thickness and the carrier concentration of the first silicon carbide layer (S20: FIG. 9), the thickness of first silicon carbide layer 10 and the carrier concentration of first silicon carbide layer 10 are measured.

Subsequently, the step of calculating the formation conditions for the second silicon carbide layer (S30: FIG. 9) is performed. The step of calculating the formation conditions for the second silicon carbide layer (S30: FIG. 9) is identical to the step of calculating the formation conditions for the second silicon carbide layer (S30: FIG. 2) described above.

In the step of calculating the formation conditions for the second silicon carbide layer (S30: FIG. 9), the formation conditions for second silicon carbide layer 20 are calculated.

Figure 10:
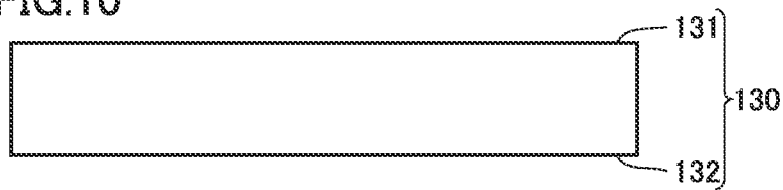
FIG. 10 is a schematic cross sectional view showing a first step of the method for manufacturing the silicon carbide epitaxial substrate in accordance with the second embodiment.

Subsequently, the step of forming the third silicon carbide layer (S50: FIG. 9) is performed. Specifically, first, third silicon carbide substrate 130 is prepared (see FIG. 10). Third silicon carbide substrate 130 is a substrate different from each of first silicon carbide substrate 110 and second silicon carbide substrate 120. Third silicon carbide substrate 130 has physical and chemical properties that are substantially identical to those of first silicon carbide substrate 110. As shown in FIG. 10, third silicon carbide substrate 130 has a ninth main surface 131 and a tenth main surface 132. Tenth main surface 132 is opposite to ninth main surface 131. The silicon carbide single crystal constituting third silicon carbide substrate 130 has a polytype of 4H-SiC, for example. Third silicon carbide substrate 130 has a diameter of more than or equal to 150 mm, for example.

Ninth main surface 131 is a {0001} plane or a plane inclined at an angle of less than or equal to 8° relative to the (0001) plane. Specifically, ninth main surface 131 is a (0001) plane or a plane inclined at an angle of less than or equal to 8° relative to the (0001) plane, for example. When ninth main surface 131 is inclined relative to the {0001} plane, the direction of inclination (off direction) is the <11-20> direction, for example. The inclined angle (off angle) relative to the {0001} plane may be more than or equal to 1°, or more than or equal to 2°. The off angle may be less than or equal to 7°, or less than or equal to 6°, or less than or equal to 4°. Ninth main surface 131 may be a (000-1) plane or a plane inclined at an angle of less than or equal to 8° relative to the (000-1) plane.

Subsequently, third silicon carbide layer 30 is formed on third silicon carbide substrate 130 by epitaxial growth, using manufacturing apparatus 200 described above. First, third silicon carbide substrate 130 is placed on susceptor 210. Then, the pressure in reaction chamber 201 is reduced from the atmospheric pressure to about $1 \times 10^{-6}$ Pa, and thereafter, increasing the temperature of third silicon carbide substrate 130 is started. While the temperature is increased, the hydrogen ($H_2$) gas as a carrier gas is introduced from fourth gas supply unit 234 into reaction chamber 201. The flow rate of the hydrogen gas is adjusted by fourth gas flow rate control unit 244.

After the temperature in reaction chamber 201 reaches about 1600° C., for example, the source material gas, the dopant gas, and the carrier gas are supplied to reaction chamber 201. Specifically, a mixed gas including silane, propane, ammonia (a third ammonia gas), and hydrogen is introduced into reaction chamber 201. In reaction chamber 201, the respective gases are thermally decomposed, and third silicon carbide layer 30 is formed on third silicon carbide substrate 130. The flow rates of silane and propane are adjusted such that the mixed gas has a C/Si ratio of about 0.9, for example. The pressure in reaction chamber 201 is 6 kPa, for example.

The flow rate of the second gas (silane gas) to be supplied to reaction chamber 201 is adjusted to 46 sccm, for example, using second gas flow rate control unit 242. The flow rate of the second gas (silane gas) may be more than or equal to 30 sccm and less than or equal to 60 sccm, for example.

Similarly, the flow rate of the first gas (propane gas) to be supplied to reaction chamber 201 is adjusted to 14 sccm, for example, using fourth gas flow rate control unit 244. The flow rate of the first gas (propane gas) may be more than or equal to 9 sccm and less than or equal to 18 sccm, for example.

Similarly, the flow rate of the third gas (ammonia gas) to be supplied to reaction chamber 201 is adjusted to 0.7 sccm, for example, using third gas flow rate control unit 243. The flow rate of the third gas (ammonia gas) may be more than or equal to 0.1 sccm and less than or equal to 1.0 sccm, for example.

Similarly, the flow rate of the fourth gas (hydrogen gas) to be supplied to reaction chamber 201 is adjusted to 120 slm, for example, using fourth gas flow rate control unit 244. The flow rate of the fourth gas (hydrogen gas) may be more than or equal to 100 slm and less than or equal to 150 slm, for example.

Figure 11:
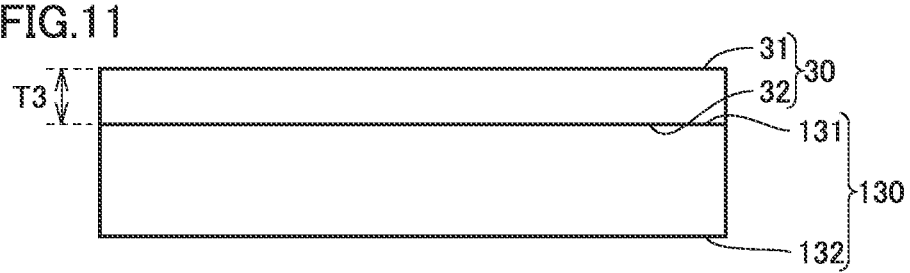
FIG. 11 is a schematic cross sectional view showing a second step of the method for manufacturing the silicon carbide epitaxial substrate in accordance with the second embodiment.

As described above, third silicon carbide layer 30 is formed on third silicon carbide substrate 130, using the third ammonia gas as a dopant gas (see FIG. 11). Third silicon carbide layer 30 has a thickness (a third thickness T3) of more than or equal to 3 μm and less than or equal to 10 μm, for example. Third thickness T3 may be identical to first thickness T1.

Third silicon carbide layer 30 includes nitrogen (N) as an n type impurity. In this case, the carrier is electrons. Third silicon carbide layer 30 has a carrier concentration of more than or equal to $1\times10^{17}$ cm$^{-3}$ and less than or equal to $1\times10^{19}$ cm$^{-3}$, for example. The carrier concentration of third silicon carbide layer 30 may be higher than the carrier concentration of first silicon carbide layer 10. As shown in FIG. 11, third silicon carbide layer 30 has an eleventh main surface 31 and a twelfth main surface 32. Twelfth main surface 32 is opposite to eleventh main surface 31. Twelfth main surface 32 is in contact with ninth main surface 131.

Subsequently, the step of measuring the thickness and the carrier concentration of the third silicon carbide layer (S60: FIG. 9) is performed. The step of measuring the thickness and the carrier concentration of the third silicon carbide layer (S60: FIG. 9) is identical to the step of measuring the thickness and the carrier concentration of the first silicon carbide layer (S20: FIG. 2) described above. In the step of measuring the thickness and the carrier concentration of the third silicon carbide layer (S60: FIG. 9), the thickness of third silicon carbide layer 30 and the carrier concentration of third silicon carbide layer 30 are measured.

Subsequently, the step of calculating the formation conditions for the fourth silicon carbide layer (S70: FIG. 9) is performed.

Specifically, a formation time of fourth silicon carbide layer 40 is calculated. When a formation time of third silicon carbide layer 30 in the step of forming third silicon carbide layer 30 is defined as a third formation time, the thickness of third silicon carbide layer 30 is defined as a third thickness, and a target thickness of fourth silicon carbide layer 40 is defined as a fourth thickness, in the step of calculating the formation conditions for fourth silicon carbide layer 40, the formation time of fourth silicon carbide layer 40 is calculated as a value obtained by multiplying a value obtained by dividing the fourth thickness by the third thickness, by the third formation time. As an example, when the third formation time is 4 minutes, the third thickness is 4 μm, and the fourth thickness is 1 μm, the formation time of second silicon carbide layer 20 is calculated as (1 μm/4 μm)×4 minutes=1 minute.

A value obtained by dividing the third thickness by the third formation time represents a formation speed of third silicon carbide layer 30. The value obtained by dividing the third thickness by the third formation time is more than or equal to 5 μm/hour and less than or equal to 30 μm/hour, for example. The value obtained by dividing the third thickness by the third formation time may be more than or equal to 7 μm/hour, or more than or equal to 10 μm/hour, for example. The value obtained by dividing the third thickness by the third formation time may be less than or equal to 25 μm/hour, or less than or equal to 20 μm/hour, for example.

Similarly, a flow rate of a fourth ammonia gas in the step of forming fourth silicon carbide layer 40 is calculated. When a flow rate of the third ammonia gas in the step of forming third silicon carbide layer 30 is defined as a third flow rate, the carrier concentration of third silicon carbide layer 30 is defined as a third concentration, and a target carrier concentration of fourth silicon carbide layer 40 is defined as a fourth concentration, in the step of calculating the formation conditions for fourth silicon carbide layer 40, the flow rate of the fourth ammonia gas in the step of forming fourth silicon carbide layer 40 is calculated as a value obtained by multiplying a value obtained by dividing the fourth concentration by the third concentration, by the third flow rate, As an example, when the third flow rate is 0.4 sccm, the third concentration is $1\times10^{18}$ cm$^{-3}$, and the fourth concentration is $2\times10^{18}$ cm$^{-3}$, the flow rate of the fourth ammonia gas in the step of forming fourth silicon carbide layer 40 is calculated as ($2\times10^{18}$ cm$^{-3}$/$1\times10^{18}$ cm$^{-3}$)×0.4 sccm=0.8 sccm.

The value obtained by dividing the fourth concentration by the third concentration is more than or equal to 0.1 and less than or equal to 5, for example. The value obtained by dividing the fourth concentration by the third concentration may be more than or equal to 0.2, or more than or equal to 0.3, for example. The value obtained by dividing the fourth concentration by the third concentration may be less than or equal to 4, or less than or equal to 3, for example. When a carrier concentration of third silicon carbide substrate 130 is defined as a third substrate concentration, the third concentration is lower than half of the third substrate concentration, for example. The third concentration may be lower than one third of the third substrate concentration, or one tenth of the third substrate concentration, for example. As described above, the formation conditions for fourth silicon carbide layer 40 are calculated.

As described above, when the flow rate of the third ammonia gas in the step of forming third silicon carbide layer 30 is defined as the third flow rate, the formation time of third silicon carbide layer 30 in the step of forming third silicon carbide layer 30 is defined as the third formation time, the thickness of third silicon carbide layer 30 is defined as the third thickness, the carrier concentration of third silicon carbide layer 30 is defined as the third concentration, the target thickness of fourth silicon carbide layer 40 is defined as the fourth thickness, and the target carrier concentration of fourth silicon carbide layer 40 is defined as the fourth concentration, in the step of calculating the formation conditions for fourth silicon carbide layer 40, a fourth formation time of fourth silicon carbide layer 40 is calculated as the value obtained by multiplying the value obtained by dividing the fourth thickness by the third thickness, by the third formation time, and a fourth flow rate of the fourth ammonia gas in the step of forming fourth silicon carbide layer 40 is calculated as the value obtained by multiplying the value obtained by dividing the fourth concentration by the third concentration, by the third flow rate.

Figure 12:
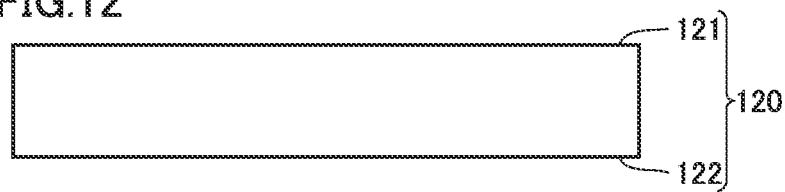
FIG. 12 is a schematic cross sectional view showing a third step of the method for manufacturing the silicon carbide epitaxial substrate in accordance with the second embodiment.

Subsequently, the step of forming the fourth silicon carbide layer (S80: FIG. 9) is performed. Specifically, first, second silicon carbide substrate 120 is prepared (see FIG. 12). Second silicon carbide substrate 120 is a substrate different from third silicon carbide substrate 130. Second silicon carbide substrate 120 has physical and chemical properties that are substantially identical to those of third silicon carbide substrate 130. As shown in FIG. 12, second silicon carbide substrate 120 has fifth main surface 121 and sixth main surface 122. Sixth main surface 122 is opposite to fifth main surface 121. The silicon carbide single crystal constituting second silicon carbide substrate 120 has a polytype of 4H-SiC, for example. Second silicon carbide substrate 120 has a diameter of more than or equal to 150 mm, for example.

Subsequently, fourth silicon carbide layer 40 is formed on second silicon carbide substrate 120 by epitaxial growth, using manufacturing apparatus 200 described above. First, second silicon carbide substrate 120 is placed on susceptor 210. Then, the pressure in reaction chamber 201 is reduced from the atmospheric pressure to about $1 \times 10^{-6}$ Pa, and thereafter, increasing the temperature of second silicon carbide substrate 120 is started. While the temperature is increased, the hydrogen ($H_2$) gas as a carrier gas is introduced from fourth gas supply unit 234 into reaction chamber 201. The flow rate of the hydrogen gas is adjusted by fourth gas flow rate control unit 244.

After the temperature in reaction chamber 201 reaches about 1600° C., for example, the source material gas, the dopant gas, and the carrier gas are supplied to reaction chamber 201. Specifically, a mixed gas including silane, propane, ammonia (the fourth ammonia gas), and hydrogen is introduced into reaction chamber 201. In reaction chamber 201, the respective gases are thermally decomposed, and fourth silicon carbide layer 40 is formed on second silicon carbide substrate 120 (see FIG. 13). The flow rates of silane and propane are adjusted such that the mixed gas has a C/Si ratio of about 0.9, for example. The pressure in reaction chamber 201 is 6 kPa, for example.

The temperature in reaction chamber 201 in the step of forming the fourth silicon carbide layer (S80: FIG. 9) is adjusted to be substantially identical to the temperature in reaction chamber 201 in the step of forming the third silicon carbide layer (S50: FIG. 9). Specifically, the temperature (° C.) in reaction chamber 201 in the step of forming the fourth silicon carbide layer (S80: FIG. 9) is within a range of ±0.2% of the temperature (° C.) in reaction chamber 201 in the step of forming the third silicon carbide layer (S50: FIG. 9).

The pressure in reaction chamber 201 in the step of forming the fourth silicon carbide layer (S80: FIG. 9) is adjusted to be substantially identical to the pressure in reaction chamber 201 in the step of forming the third silicon carbide layer (S50: FIG. 9). Specifically, the pressure (kPa) in reaction chamber 201 in the step of forming the fourth silicon carbide layer (S80: FIG. 9) is within a range of ±2% of the pressure (kPa) in reaction chamber 201 in the step of forming the third silicon carbide layer (S50: FIG. 9).

The flow rate of the second gas (silane gas) in the step of forming the fourth silicon carbide layer (S80: FIG. 9) is adjusted to be substantially identical to the flow rate of the second gas (silane gas) in the step of forming the third silicon carbide layer (S50: FIG. 9). Specifically, the flow rate (sccm) of the second gas (silane gas) in the step of forming the fourth silicon carbide layer (S80: FIG. 9) is within a range of ±0.5% of the flow rate (sccm) of the second gas (silane gas) in the step of forming the third silicon carbide layer (S50: FIG. 9).

The flow rate of the first gas (propane gas) in the step of forming the fourth silicon carbide layer (S80: FIG. 9) is adjusted to be substantially identical to the flow rate of the first gas (propane gas) in the step of forming the third silicon carbide layer (S50: FIG. 9). Specifically, the flow rate (sccm) of the first gas (propane gas) in the step of forming the fourth silicon carbide layer (S80: FIG. 9) is within a range of ±0.5% of the flow rate (sccm) of the first gas (propane gas) in the step of forming the third silicon carbide layer (S50: FIG. 9).

The flow rate of the fourth gas (hydrogen gas) in the step of forming the fourth silicon carbide layer (S80: FIG. 9) is adjusted to be substantially identical to the flow rate of the fourth gas (hydrogen gas) in the step of forming the third silicon carbide layer (S50: FIG. 9). Specifically, the flow rate (slm) of the fourth gas (hydrogen gas) in the step of forming the fourth silicon carbide layer (S80: FIG. 9) is within a range of ±0.5% of the flow rate (slm) of the fourth gas (hydrogen gas) in the step of forming the third silicon carbide layer (S50: FIG. 9).

Figure 13:
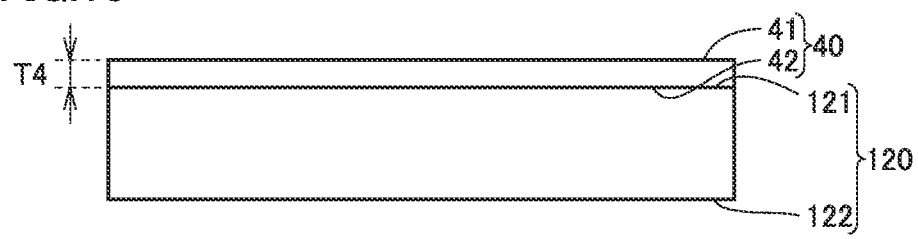
FIG. 13 is a schematic cross sectional view showing a fourth step of the method for manufacturing the silicon carbide epitaxial substrate in accordance with the second embodiment.

As described above, fourth silicon carbide layer 40 is formed on second silicon carbide substrate 120, using the fourth ammonia gas as a dopant gas (see FIG. 13). Fourth silicon carbide layer 40 has a thickness (a fourth thickness T4) of more than or equal to 0.5 μm and less than or equal to 3 μm, for example. Fourth thickness T4 may be more than or equal to 0.6 μm, or more than or equal to 0.7 μm, for example. Fourth thickness T4 may be less than or equal to 2.8 μm, or less than or equal to 2.6 μm, for example. The step of forming the third silicon carbide layer (S50: FIG. 9) and the step of forming the fourth silicon carbide layer (S80: FIG. 9) are performed using an identical apparatus.

Fourth silicon carbide layer 40 includes nitrogen (N) as an n type impurity. In this case, the carrier is electrons. Fourth silicon carbide layer 40 has a carrier concentration of more than or equal to $1 \times 10^{17}$ cm$^{-3}$ and less than or equal to $1 \times 10^{19}$ cm$^{-3}$, for example. As shown in FIG. 13, fourth silicon carbide layer 40 has a thirteenth main surface 41 and a fourteenth main surface 42. Fourteenth main surface 42 is opposite to thirteenth main surface 41. Fourteenth main surface 42 is in contact with fifth main surface 121.

Subsequently, the step of forming the second silicon carbide layer (S90: FIG. 9) is performed. In the step of forming the second silicon carbide layer (S90: FIG. 9), second silicon carbide layer 20 is formed on fourth silicon carbide layer 40 by epitaxial growth (see FIG. 14). Specifically, the source material gas, the dopant gas, and the carrier gas are supplied to reaction chamber 201. Specifically, a mixed gas including silane, propane, ammonia (the fourth ammonia gas), and hydrogen is introduced into reaction chamber 201. In reaction chamber 201, the respective gases are thermally decomposed, and second silicon carbide layer 20 is formed on fourth silicon carbide layer 40. The temperature in reaction chamber 201 is 1600° C., for example. The flow rates of silane and propane are adjusted such that the mixed gas has a C/Si ratio of about 1.0, for example. The pressure in reaction chamber 201 is 6 kPa, for example.

The temperature in reaction chamber 201 in the step of forming the second silicon carbide layer (S90: FIG. 9) is adjusted to be substantially identical to the temperature in reaction chamber 201 in the step of forming the first silicon carbide layer (S10: FIG. 9). The pressure in reaction chamber 201 in the step of forming the second silicon carbide layer (S90: FIG. 9) is adjusted to be substantially identical to the pressure in reaction chamber 201 in the step of forming the first silicon carbide layer (S10: FIG. 9).

The flow rate of the second gas (silane gas) in the step of forming the second silicon carbide layer (S90: FIG. 9) is adjusted to be substantially identical to the flow rate of the second gas (silane gas) in the step of forming the first silicon carbide layer (S10: FIG. 9). The flow rate of the first gas (propane gas) in the step of forming the second silicon carbide layer (S90: FIG. 9) is adjusted to be substantially identical to the flow rate of the first gas (propane gas) in the step of forming the first silicon carbide layer (S10: FIG. 9). The flow rate of the fourth gas (hydrogen gas) in the step of forming the second silicon carbide layer (S90: FIG. 9) is adjusted to be substantially identical to the flow rate of the fourth gas (hydrogen gas) in the step of forming the first silicon carbide layer (S10: FIG. 9).

Figure 14:
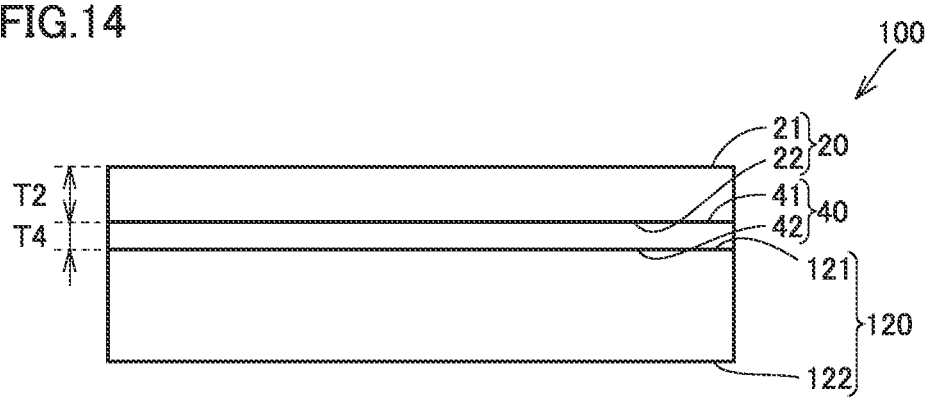
FIG. 14 is a schematic cross sectional view showing a fifth step of the method for manufacturing the silicon carbide epitaxial substrate in accordance with the second embodiment.

As described above, second silicon carbide layer 20 is formed on fourth silicon carbide layer 40 (see FIG. 14). The step of forming the fourth silicon carbide layer (S80: FIG. 9) is performed before the step of forming the second silicon carbide layer (S90: FIG. 9). Second silicon carbide layer 20 has a thickness (second thickness T2) of 10 μm, for example. Second silicon carbide layer 20 includes nitrogen (N) as an n type impurity. Second silicon carbide layer 20 has a carrier concentration of more than or equal to $1 \times 10^{14}$ cm$^{-3}$ and less than or equal to $1 \times 10^{16}$ cm$^{-3}$, for example. As shown in FIG. 14, second silicon carbide layer 20 has seventh main surface 21 and eighth main surface 22. Eighth main surface 22 is opposite to seventh main surface 21. Eighth main surface 22 is in contact with thirteenth main surface 41. As described above, silicon carbide epitaxial substrate 100 having second silicon carbide substrate 120, fourth silicon carbide layer 40, and second silicon carbide layer 20 is manufactured.

Third Embodiment

Next, a method for manufacturing silicon carbide epitaxial substrate 100 in accordance with a third embodiment will be described.

Silicon carbide epitaxial substrate 100 having three or more silicon carbide layers can be manufactured by repeating calculation of formation conditions for a silicon carbide layer based on the step of determining the formation conditions for the silicon carbide layer, and actual formation of the silicon carbide layer based on the result of the calculation, as described in the method for manufacturing silicon carbide epitaxial substrate 100 in accordance with the first embodiment and the method for manufacturing silicon carbide epitaxial substrate 100 in accordance with the second embodiment.

Figure 15:
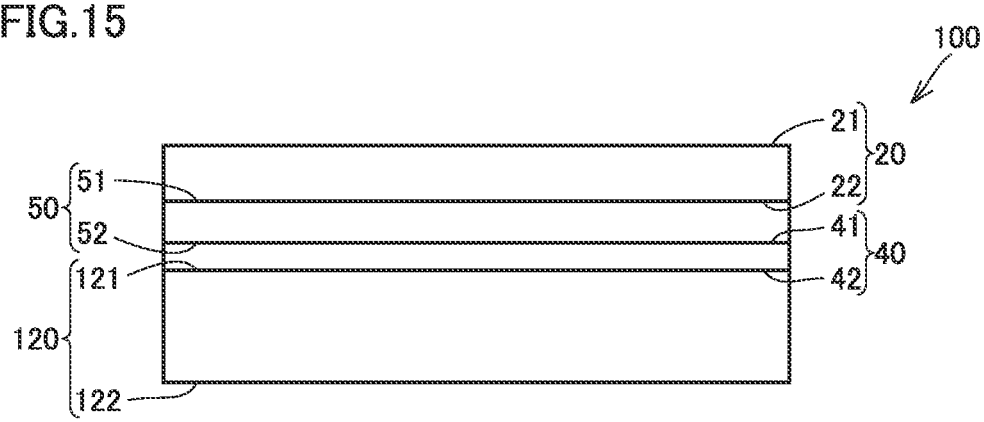
FIG. 15 is a schematic cross sectional view showing a configuration of a silicon carbide epitaxial substrate manufactured by a method for manufacturing a silicon carbide epitaxial substrate in accordance with a third embodiment.

As shown in FIG. 15, silicon carbide epitaxial substrate 100 manufactured by the method for manufacturing silicon carbide epitaxial substrate 100 in accordance with the third embodiment has second silicon carbide substrate 120, fourth silicon carbide layer 40, a fifth silicon carbide layer 50, and second silicon carbide layer 20. Fourth silicon carbide layer 40 is provided on second silicon carbide substrate 120. Fifth silicon carbide layer 50 is provided on fourth silicon carbide layer 40. Second silicon carbide layer 20 is provided on fifth silicon carbide layer 50.

Fifth silicon carbide layer 50 includes nitrogen (N) as an n type impurity. In this case, the carrier is electrons. Fifth silicon carbide layer 50 has a carrier concentration of more than or equal to $1 \times 10^{18}$ cm$^{-3}$ and less than or equal to $1 \times 10^{20}$ cm$^{-3}$, for example. As shown in FIG. 15, fifth silicon carbide layer 50 has a fifteenth main surface 51 and a sixteenth main surface 52. Sixteenth main surface 52 is opposite to fifteenth main surface 51. Fifteenth main surface 51 is in contact with eighth main surface 22. Sixteenth main surface 52 is in contact with thirteenth main surface 41.

Next, the function and effect of the method for calculating the manufacturing conditions for silicon carbide epitaxial substrate 100 and the method for manufacturing silicon carbide epitaxial substrate 100 in accordance with the present embodiment will be described.

When a silicon carbide layer is formed by epitaxial growth, it is necessary to perform maintenance of a growth furnace for every constant accumulated film thickness. In the maintenance of the growth furnace (manufacturing apparatus 200), silicon carbide deposited on members in the furnace is removed. On that occasion, the members in the furnace are disassembled. The members in the furnace are cleaned, and thereafter are assembled. Accordingly, the environment in the furnace may subtly change before and after the maintenance.

The growth rate of a silicon carbide layer and the effect of introducing a dopant gas into the silicon carbide layer vary depending on the temperature in the furnace. Accordingly, the temperature in the furnace is set to the same temperature as much as possible before and after the maintenance. However, even if the temperature in the furnace is set to substantially the same temperature before and after the maintenance, it is difficult to completely equalize the environment in the furnace after the maintenance with the environment in the furnace before the maintenance. Accordingly, even when a silicon carbide layer is formed by epitaxial growth after the maintenance using setting conditions which are completely identical to those used before the maintenance, the thickness of the silicon carbide layer and the carrier concentration of the silicon carbide layer after the maintenance may be different from the thickness of a silicon carbide layer and the carrier concentration of the silicon carbide layer before the maintenance. Therefore, in order to form a silicon carbide layer having the same properties as those formed before the maintenance by epitaxial growth after the maintenance, it is necessary to perform adjustment of formation conditions (condition adjustment) for the silicon carbide layer after the maintenance.

Generally, a silicon carbide layer is formed using a nitrogen gas as a dopant gas. As the flow rate of the nitrogen gas introduced into the growth furnace increases, the carrier concentration of the silicon carbide layer increases. However, when the flow rate of the nitrogen gas increases, the efficiency of introducing the nitrogen gas into the silicon carbide layer decreases. That is, the carrier concentration of the silicon carbide layer is not completely proportional to the flow rate of the nitrogen gas (i.e., there is a low linearity therebetween). Accordingly, when the flow rate of the nitrogen gas is changed, it is difficult to accurately estimate the carrier concentration.

In addition, since the nitrogen gas is chemically very stable, it is difficult to thermally decompose the nitrogen gas. Nitrogen that is not completely decomposed is accumulated in the growth furnace with the lapse of time. Accordingly, there is a tendency that the carrier concentration in a later stage of epitaxial growth is higher than the carrier concentration in an initial stage of epitaxial growth (memory effect). Thus, when the thickness of the silicon carbide layer is changed, it is difficult to accurately estimate the carrier concentration. As described above, when the silicon carbide layer is formed by epitaxial growth using the nitrogen gas as a dopant gas, it is difficult to accurately estimate the carrier concentration.

According to the method for calculating the manufacturing conditions for silicon carbide epitaxial substrate 100 and the method for manufacturing silicon carbide epitaxial substrate 100 in accordance with the present embodiment, first silicon carbide layer 10 is formed on silicon carbide substrate 110, using the first ammonia gas as a dopant gas. The flow rate of the second ammonia gas in the step of forming second silicon carbide layer 20 is calculated as the value obtained by multiplying the value obtained by dividing the second concentration by the first concentration, by the first flow rate.

In the case of the ammonia gas, there is a high linearity between the flow rate of a dopant and the carrier concentration, when compared with the case of the nitrogen gas. Accordingly, when the silicon carbide layer is formed by epitaxial growth using the ammonia gas as a dopant gas, the carrier concentration can be adjusted accurately based on a simple computational expression that the carrier concentration is proportional to the flow rate of the dopant. Therefore, in a case where the silicon carbide layer is formed by epitaxial growth using the ammonia gas as a dopant gas, the accuracy of the carrier concentration of the silicon carbide layer can be improved, while significantly simplifying a condition adjustment step, when compared with a case where the silicon carbide layer is formed by epitaxial growth using the nitrogen gas as a dopant gas.

In addition, the influence of the memory effect on the ammonia gas is negligibly small. Accordingly, when the silicon carbide layer is formed by epitaxial growth using the ammonia gas as a dopant gas, the carrier concentration of the silicon carbide layer is constant, irrespective of epitaxial growth time. As a result, the accuracy of the carrier concentration of the silicon carbide layer can be improved.

According to the method for calculating the manufacturing conditions for silicon carbide epitaxial substrate 100 and the method for manufacturing silicon carbide epitaxial substrate 100 in accordance with the present embodiment, the carrier concentration of the silicon carbide layer is lower than half of the carrier concentration of the silicon carbide substrate. An FT-IR calculates the thickness of the silicon carbide layer, utilizing an interference spectrum of infrared light caused by the difference in refractive index resulting from the difference between the carrier concentration of the silicon carbide substrate and the carrier concentration of the silicon carbide layer. Accordingly, when the thickness of the silicon carbide layer is measured using the FT-IR, it is desirable that the carrier concentration of the silicon carbide layer is lower than half of the carrier concentration of the silicon carbide substrate.

Example 1

(Preparation of Samples)

First, as a Comparative Example, a silicon carbide layer was grown on a silicon carbide substrate by epitaxial growth, using a nitrogen gas. Specifically, the silicon carbide layer was formed by epitaxial growth, using a silane gas, a propane gas, and the nitrogen gas. More specifically, the flow rate of the silane gas was set to 120 sccm. The flow rate of the propane gas was set to 40 sccm. The flow rate of the nitrogen gas was set to 27.0 sccm. The flow rate of a hydrogen gas was set to 130 slm. Three types of samples adopting different epitaxial growth times were prepared. The epitaxial growth times were set to 10 minutes, 75 minutes, and 100 minutes.

Then, as an Example, a silicon carbide layer was grown on a silicon carbide substrate by epitaxial growth, using an ammonia gas as a dopant gas. Specifically, the silicon carbide layer was formed by epitaxial growth, using a silane gas, a propane gas, and the ammonia gas. More specifically, the flow rate of the silane gas was set to 120 sccm. The flow rate of the propane gas was set to 40 sccm. The flow rate of the ammonia gas was set to 0.067 sccm. The flow rate of a hydrogen gas was set to 130 slm. Three types of samples adopting different epitaxial growth times were prepared. The epitaxial growth times were set to 10 minutes, 75 minutes, and 100 minutes.

(Measurement of Carrier Concentration)

Next, the carrier concentration of each silicon carbide layer was measured with a mercury probe-type C-V measurement apparatus. Measurement conditions for the carrier concentration of each silicon carbide layer are as described above.

(Results of Measurement)

Figure 16:
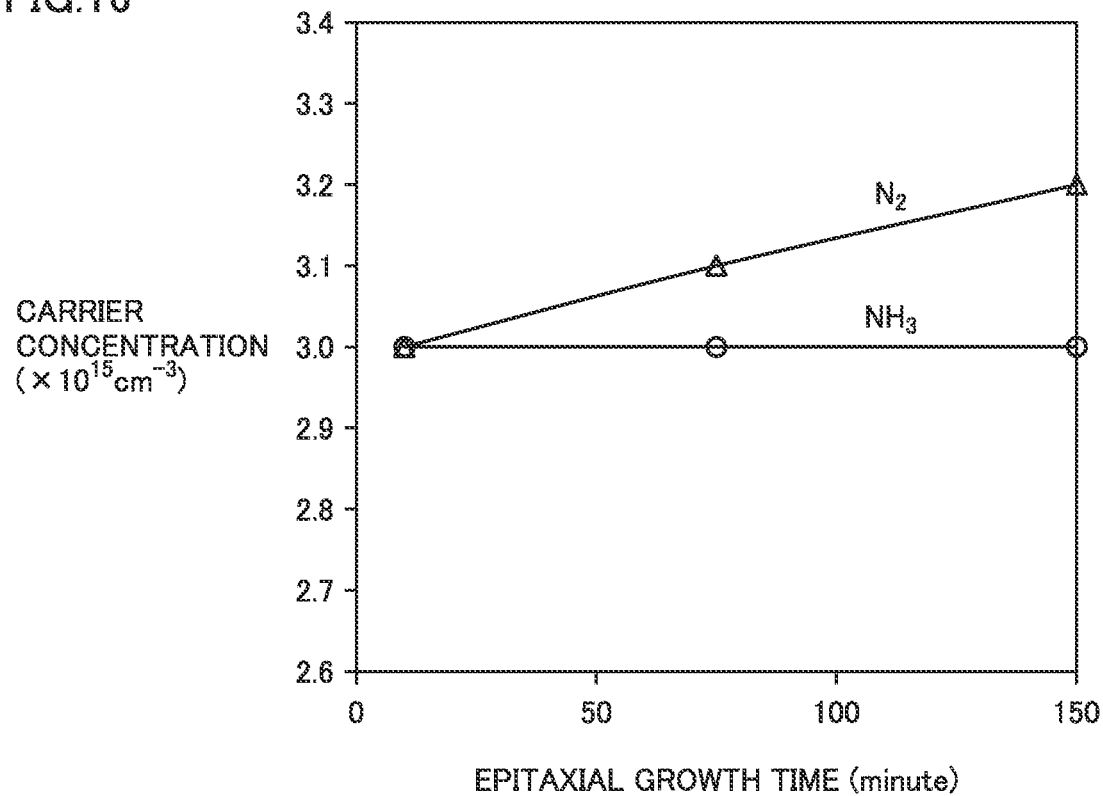
FIG. 16 is a view showing the relation between carrier concentration and epitaxial growth time.

As shown in FIG. 16, the carrier concentrations of the silicon carbide layers in accordance with the samples of the Comparative Example were $3.0 \times 10^{15}$ cm$^{-3}$ (epitaxial growth time: 10 minutes), $3.1 \times 10^{15}$ cm$^{-3}$ (epitaxial growth time: 75 minutes), and $3.2 \text{-} 10^{15}$ cm$^{-3}$ (epitaxial growth time: 150 minutes). In contrast, the carrier concentrations of the silicon carbide layers in accordance with the samples of the Example were $3.0 \times 10^{15}$ cm$^{-3}$ (epitaxial growth time: 10 minutes), $3.0 \times 10^{15}$ cm$^{-3}$ (epitaxial growth time: 75 minutes), and $3.0 \times 10^{15}$ cm$^{-3}$ (epitaxial growth time: 150 minutes).

As shown in FIG. 16, in the case of the silicon carbide layer formed using the nitrogen gas, there is a tendency that the carrier concentration of the silicon carbide layer increases as the epitaxial growth time increases (memory effect). In contrast, in the case of the silicon carbide layer formed using the ammonia gas, even when the epitaxial growth time increases, the carrier concentration of the silicon carbide layer is constant and hardly changes. That is, unlike the case of the nitrogen gas, in the case of the ammonia gas, the carrier concentration of the silicon carbide layer is constant, irrespective of the epitaxial growth time. Accordingly, even when the thickness of the silicon carbide layer is changed, the carrier concentration of the silicon carbide layer can be accurately adjusted.

Example 2

(Preparation of Samples)

First, as a Comparative Example, a silicon carbide layer was grown on a silicon carbide substrate by epitaxial growth, using a nitrogen gas. Specifically, the silicon carbide layer was formed by epitaxial growth, using a silane gas, a propane gas, and the nitrogen gas. More specifically, the flow rate of the silane gas was set to 120 sccm. The flow rate of the propane gas was set to 40 sccm. The flow rate of a hydrogen gas was set to 130 slm. Three types of samples adopting different flow rates of the nitrogen gas were prepared. The flow rates of the nitrogen gas were set to 28.0 sccm, 50.0 sccm, and 70.0 sccm.

Then, as an Example, a silicon carbide layer was grown on silicon carbide substrate 110 by epitaxial growth, using an ammonia gas as a dopant gas. Specifically, the silicon carbide layer was formed by epitaxial growth, using a silane gas, a propane gas, and the ammonia gas. More specifically, the flow rate of the silane gas was set to 120 sccm. The flow rate of the propane gas was set to 40 sccm. The flow rate of a hydrogen gas was set to 130 slm. Three types of samples adopting different flow rates of the ammonia gas were prepared. The flow rates of the ammonia gas were set to 0.065 sccm, 0.125 sccm, and 0.184 sccm.

(Measurement of Carrier Concentration)

Next, the carrier concentration of each silicon carbide layer was measured with a mercury probe-type C-V measurement apparatus. Measurement conditions for the carrier concentration of each silicon carbide layer are as described above.

(Results of Measurement)

Figure 17:
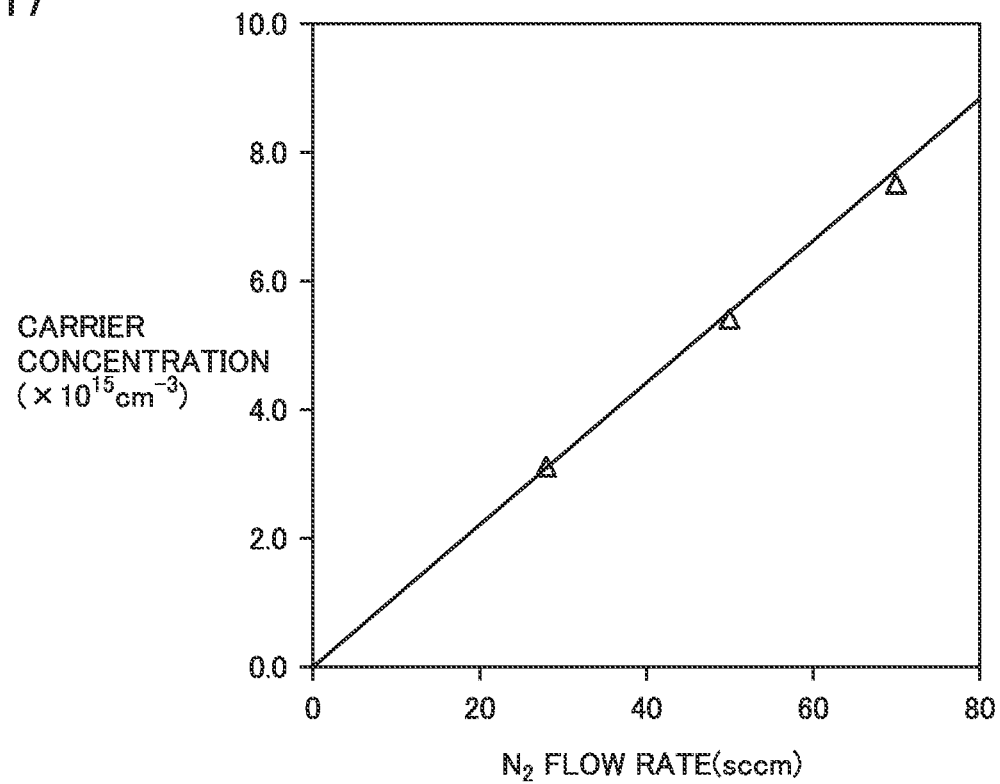
FIG. 17 is a view showing the relation between the carrier concentration and the flow rate of a nitrogen gas.

As shown in FIG. 17, the carrier concentrations of the silicon carbide layers in accordance with the samples of the Comparative Example were $3.1\times10^{15}$ cm$^{-3}$ (the flow rate of the nitrogen gas: 28.0 sccm), $5.4\times10^{15}$ cm$^{-3}$ (the flow rate of the nitrogen gas: 50.0 sccm), and $7.5\times10^{15}$ cm$^{-3}$ (the flow rate of the nitrogen gas: 70.0 sccm).

Figure 18:
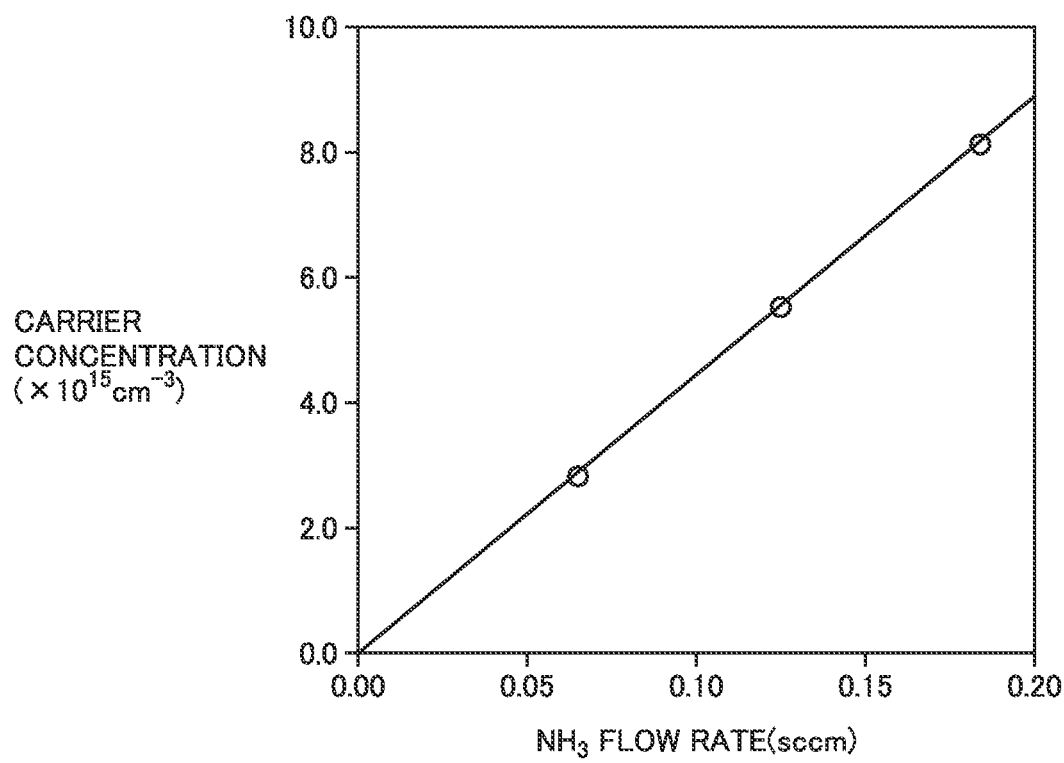
FIG. 18 is a view showing the relation between the carrier concentration and the flow rate of an ammonia gas.

As shown in FIG. 18, the carrier concentrations of the silicon carbide layers in accordance with the samples of the Example were $2.9\times10^{15}$ cm$^{-3}$ (the flow rate of the ammonia gas: 0.065 sccm), $5.6\times10^{15}$ cm$^{-3}$ (the flow rate of the ammonia gas: 0.125 sccm), and $8.2\times10^{15}$ cm$^{-3}$ (the flow rate of the ammonia gas: 0.184 sccm).

As shown in FIG. 17, in the case of the silicon carbide layer formed using the nitrogen gas, it was confirmed that the carrier concentration of the silicon carbide layer with respect to the flow rate of the doping gas slightly deviates from linear approximation (i.e., there is a low linearity therebetween). Specifically, there is a tendency that the carrier concentration of the silicon carbide layer deviates from a linear approximation straight line as the flow rate of the doping gas increases. Accordingly, in the case of using the nitrogen gas, it is not possible to adjust the carrier concentration of the silicon carbide layer based on a simple computational expression that the carrier concentration of the silicon carbide layer is proportional to the flow rate of the doping gas.

In contrast, as shown in FIG. 18, in the case of the silicon carbide layer formed using the ammonia gas, the carrier concentration of the silicon carbide layer with respect to the flow rate of the doping gas substantially matches linear approximation (i.e., there is a high linearity therebetween). Accordingly, unlike the case of using the nitrogen gas, in the case of using the ammonia gas, it is possible to accurately adjust the carrier concentration of the silicon carbide layer based on a simple computational expression that the carrier concentration of the silicon carbide layer is proportional to the flow rate of the doping gas.

It should be understood that the embodiments and the examples disclosed herein are illustrative and non-restrictive in every respect. The scope of the present invention is defined by the scope of the claims, rather than the embodiments described above, and is intended to include any modifications within the scope and meaning equivalent to the scope of the claims.

REFERENCE SIGNS LIST

1: orientation flat; 2: arc-shaped portion; 3: diameter; 10: first silicon carbide layer; 11: third main surface; 12: fourth main surface; 20: second silicon carbide layer; 21: seventh main surface; 22: eighth main surface; 30: third silicon carbide layer; 31: eleventh main surface, 32: twelfth main surface; 40: fourth silicon carbide layer; 41: thirteenth main surface; 42: fourteenth main surface; 50: fifth silicon carbide layer; 51: fifteenth main surface; 52: sixteenth main surface; 100: silicon carbide epitaxial substrate; 101: first direction; 102: second direction; 110: silicon carbide substrate (first silicon carbide substrate); 111: first main surface; 112: second main surface; 113: outer edge portion; 120: second silicon carbide substrate; 121: fifth main surface; 122: sixth main surface; 130: third silicon carbide substrate; 131: ninth main surface; 132: tenth main surface; 200: manufacturing apparatus; 201: reaction chamber; 202: stage; 203: heating element; 204: quartz tube; 205: inner wall surface; 207: gas introduction port; 208: gas exhaust port; 209: rotation axis; 210: susceptor; 231: first gas supply unit; 232: second gas supply unit; 233: third gas supply unit; 234: fourth gas supply unit; 235: gas supply unit; 241: first gas flow rate control unit; 242: second gas flow rate control unit; 243: third gas flow rate control unit; 244: fourth gas flow rate control unit; 245: control unit; T1: first thickness; T2: second thickness; T3: third thickness; T4: fourth thickness.

The invention claimed is:

1. A method for manufacturing a silicon carbide epitaxial substrate, the method comprising:
    forming a first silicon carbide layer on a first silicon carbide substrate by epitaxial growth, using a first ammonia gas as a dopant gas;
    measuring a thickness of the first silicon carbide layer and a carrier concentration of the first silicon carbide layer;
    calculating formation conditions for a second silicon carbide layer; and
    forming the second silicon carbide layer on a second silicon carbide substrate by epitaxial growth, using a second ammonia gas as a dopant gas, wherein
    when a flow rate of the first ammonia gas in the forming of the first silicon carbide layer by epitaxial growth is defined as a first flow rate, a formation time of the first silicon carbide layer in the forming of the first silicon carbide layer by epitaxial growth is defined as a first formation time, the thickness of the first silicon carbide layer is defined as a first thickness, the carrier concentration of the first silicon carbide layer is defined as a first concentration, a target thickness of the second silicon carbide layer is defined as a second thickness, and a target carrier concentration of the second silicon carbide layer is defined as a second concentration,
    in the calculating of the formation conditions for the second silicon carbide layer, a second formation time of the second silicon carbide layer is calculated as a value obtained by multiplying a value obtained by dividing the second thickness by the first thickness, by the first formation time, and a second flow rate of the second ammonia gas in the forming of the second silicon carbide layer by epitaxial growth is calculated as a value obtained by multiplying a value obtained by dividing the second concentration by the first concentration, by the first flow rate,
    in the forming of the second silicon carbide layer by epitaxial growth, the second silicon carbide layer is formed using the second formation time and the second flow rate, and
    the forming of the first silicon carbide layer by epitaxial growth and the forming of the second silicon carbide layer by epitaxial growth are performed using an identical apparatus.

2. The method for manufacturing the silicon carbide epitaxial substrate according to claim 1, wherein the value obtained by dividing the second concentration by the first concentration is more than or equal to 0.1 and less than or equal to 5.

3. The method for manufacturing the silicon carbide epitaxial substrate according to claim 1, wherein a value obtained by dividing the first thickness by the first formation time is more than or equal to 5 μm/hour and less than or equal to 30 μm/hour.

4. The method for manufacturing the silicon carbide epitaxial substrate according to claim 1, wherein, when a carrier concentration of the first silicon carbide substrate is defined as a first substrate concentration, the first concentration is lower than half of the first substrate concentration.

5. The method for manufacturing the silicon carbide epitaxial substrate according to claim 1, comprising:

forming a third silicon carbide layer on a third silicon carbide substrate by epitaxial growth, using a third ammonia gas as a dopant gas;

measuring a thickness of the third silicon carbide layer and a carrier concentration of the third silicon carbide layer;

calculating formation conditions for a fourth silicon carbide layer; and forming the fourth silicon carbide layer on the second silicon carbide substrate by epitaxial growth, using a fourth ammonia gas as a dopant gas, before the forming of the second silicon carbide layer by epitaxial growth, wherein the second silicon carbide layer is formed on the fourth silicon carbide layer, when a flow rate of the third ammonia gas in the forming of the third silicon carbide layer by epitaxial growth is defined as a third flow rate, a formation time of the third silicon carbide layer in the forming of the third silicon carbide layer by epitaxial growth is defined as a third formation time, the thickness of the third silicon carbide layer is defined as a third thickness, the carrier concentration of the third silicon carbide layer is defined as a third concentration, a target thickness of the fourth silicon carbide layer is defined as a fourth thickness, and a target carrier concentration of the fourth silicon carbide layer is defined as a fourth concentration, in the calculating of the formation conditions for the fourth silicon carbide layer, a fourth formation time of the fourth silicon carbide layer is calculated as a value obtained by multiplying a value obtained by dividing the fourth thickness by the third thickness, by the third formation time, and a fourth flow rate of the fourth ammonia gas in the forming of the fourth silicon carbide layer by epitaxial growth is calculated as a value obtained by multiplying a value obtained by dividing the fourth concentration by the third concentration, by the third flow rate, in the forming of the fourth silicon carbide layer by epitaxial growth, the fourth silicon carbide layer is formed using the fourth formation time and the fourth flow rate, and the forming of the third silicon carbide layer by epitaxial growth and the forming of the fourth silicon carbide layer by epitaxial growth are performed using an identical apparatus.

6. The method for manufacturing the silicon carbide epitaxial substrate according to claim 5, wherein the value obtained by dividing the fourth concentration by the third concentration is more than or equal to 0.1 and less than or equal to 5.

7. The method for manufacturing the silicon carbide epitaxial substrate according to claim 5 or 6, wherein a value obtained by dividing the third thickness by the third formation time is more than or equal to 5 μm/hour and less than or equal to 30 μm/hour.

8. The method for manufacturing the silicon carbide epitaxial substrate according to claim 5, wherein, when a carrier concentration of the third silicon carbide substrate is defined as a third substrate concentration, the third concentration is lower than half of the third substrate concentration.

\* \* \* \* \*